United States Patent
Sharma et al.

(10) Patent No.: US 12,057,388 B2
(45) Date of Patent: Aug. 6, 2024

(54) INTEGRATED CIRCUIT STRUCTURES HAVING LINERLESS SELF-FORMING BARRIERS

(71) Applicant: Intel Corporation, Santa Clara, CA (US)

(72) Inventors: Abhishek A. Sharma, Hillsboro, OR (US); Carl Naylor, Portland, OR (US); Urusa Alaan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 853 days.

(21) Appl. No.: 16/580,149

(22) Filed: Sep. 24, 2019

(65) Prior Publication Data
US 2021/0090991 A1    Mar. 25, 2021

(51) Int. Cl.
*H01L 23/522* (2006.01)
*H01L 23/528* (2006.01)
*H01L 23/532* (2006.01)

(52) U.S. Cl.
CPC ...... *H01L 23/5226* (2013.01); *H01L 23/5283* (2013.01); *H01L 23/53238* (2013.01); *H01L 23/53266* (2013.01)

(58) Field of Classification Search
CPC ............. H01L 23/5226; H01L 23/5283; H01L 23/53238; H01L 23/53266
See application file for complete search history.

(56) References Cited

U.S. PATENT DOCUMENTS

| | | | |
|---|---|---|---|
| 9,741,609 B1 | 8/2017 | Cheng et al. | |
| 2005/0170642 A1* | 8/2005 | Hineman | H01L 21/76807 257/E21.586 |
| 2012/0070981 A1 | 3/2012 | Clendenning et al. | |
| 2014/0183738 A1 | 7/2014 | Jezewski et al. | |
| 2015/0084101 A1* | 3/2015 | Adam | H01L 27/1211 257/288 |
| 2015/0102431 A1* | 4/2015 | Chi | H01L 29/513 257/411 |
| 2015/0380296 A1 | 12/2015 | Antonelli et al. | |

(Continued)

FOREIGN PATENT DOCUMENTS

WO    WO-2018118092 A1 *    6/2018    ......... H01L 21/0274

OTHER PUBLICATIONS

Notice of Allowance for Germany Patent Application No. 102020120786.7 mailed Apr. 28, 2022, 9 pgs., no translation.

(Continued)

*Primary Examiner* — Lex H Malsawma
*Assistant Examiner* — Sean Ayers Winters
(74) *Attorney, Agent, or Firm* — Schwabe, Williamson & Wyatt, P.C.

(57) ABSTRACT

Integrated circuit structures having linerless self-forming barriers, and methods of fabricating integrated circuit structures having linerless self-forming barriers, are described. In an example, an integrated circuit structure includes a dielectric material above a substrate. An interconnect structure is in a trench in the dielectric material. The interconnect structure includes a conductive fill material and a two-dimensional (2D) crystalline liner. The 2D crystalline liner is in direct contact with the dielectric material and with the conductive fill material. The 2D crystalline liner includes a same metal species as the conductive fill material.

23 Claims, 17 Drawing Sheets

(56) References Cited

U.S. PATENT DOCUMENTS

| | | | |
|---|---|---|---|
| 2016/0079172 A1* | 3/2016 | Yang | H01L 23/53238 |
| | | | 438/618 |
| 2016/0284854 A1* | 9/2016 | Okazaki | H01L 29/24 |
| 2017/0256647 A1* | 9/2017 | Nakazawa | H01L 29/24 |
| 2018/0033833 A1* | 2/2018 | An | G06F 3/0446 |
| 2018/0130703 A1 | 5/2018 | Sardesai et al. | |

OTHER PUBLICATIONS

Office Action for Taiwan Patent No. 109120605, mailed Sep. 15, 2023, 12 pgs.
Office Action from German Patent Application No. 102020120786.7, mailed Dec. 14, 2021, 8 pgs.

\* cited by examiner

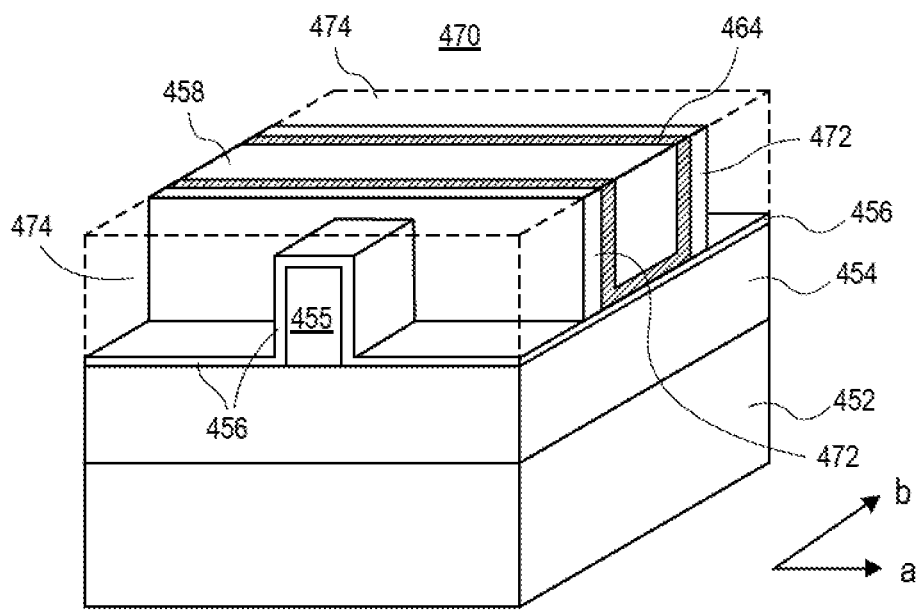
FIG. 4C
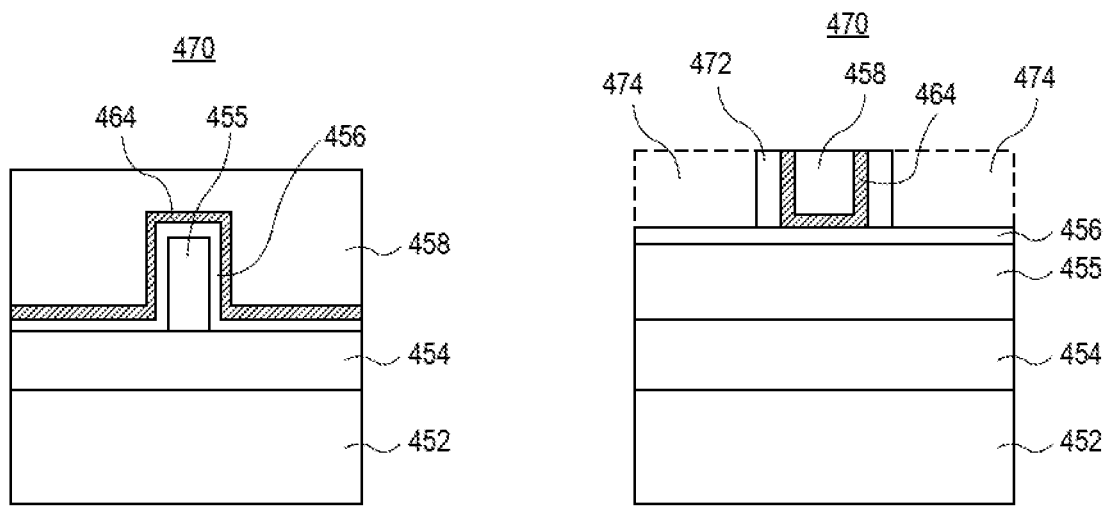
FIG. 4D  FIG. 4E

INTEGRATED CIRCUIT STRUCTURES HAVING LINERLESS SELF-FORMING BARRIERS

TECHNICAL FIELD

Embodiments of the disclosure are in the field of integrated circuit structures and, in particular, integrated circuit structures having linerless self-forming barriers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

The performance of a thin-film transistor (TFT) may depend on a number of factors. For example, the efficiency at which a TFT is able to operate may depend on the sub threshold swing of the TFT, characterizing the amount of change in the gate-source voltage needed to achieve a given change in the drain current. A smaller sub threshold swing enables the TFT to turn off to a lower leakage value when the gate-source voltage drops below the threshold voltage of the TFT. The conventional theoretical lower limit at room temperature for the sub threshold swing of the TFT is 60 millivolts per decade of change in the drain current.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIGS. 4C, 4D, and 4E illustrate angled and direct cross-sectional views of a thin film integrated circuit structure having relatively increased width and a linerless self-forming barrier, in accordance with an embodiment of the present disclosure.

DESCRIPTION OF THE EMBODIMENTS

Figure 1:
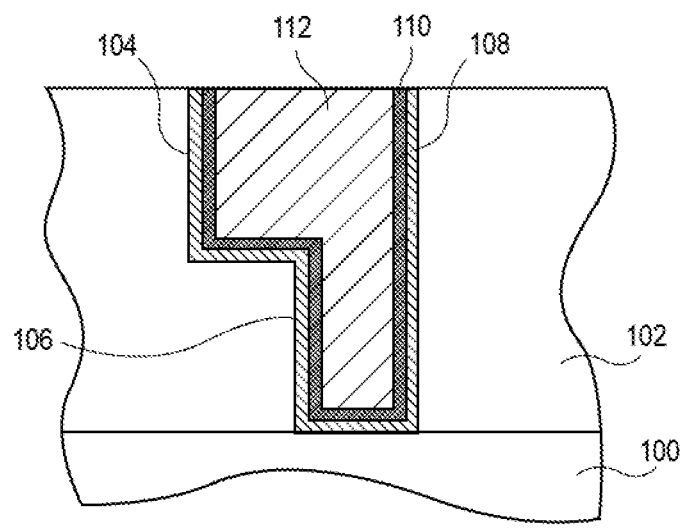
FIG. 1 illustrates a cross-sectional view of an interconnect structure.

Integrated circuit structures having linerless self-forming barriers, and methods of fabricating integrated circuit structures having linerless self-forming barriers, are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating integrated circuit structures having self-forming barrier layers. Embodiments may include or pertain to one or more of back end transistors, semiconducting oxide materials, thin film transistors, gate electrodes, and system-on-chip (SoC) technologies. One or more embodiments may be implemented to realize high performance backend transistors to potentially increase monolithic integration of backend logic plus memory in SoCs of future technology nodes.

In accordance with an embodiment of the present disclosure, linerless self-forming barriers are described for conductive structures, such as conductive structures including copper (Cu), tungsten (W), and/or cobalt (Co). Embodiments described herein may be implemented to fabricate interconnect structures (e.g., linerless single damascene or dual damascene structures in direct contact with an interlayer dielectric (ILD) material), contacts for transistor structures (e.g., as a layer in direct contact with a semiconducting oxide), or gate electrodes (e.g., to change a workfunction of a gate electrode). In an embodiment, a barrier layer described herein has a same metal species as fill material. Barrier layers described herein may benefit one or more of adhesion, electromigration, and/or resistivity.

To provide context, conductive interconnects typically rely on liners and barriers to prevent copper (Cu) diffusing into a substrate or adjacent ILD material. However, such structures may be associated with high cost (e.g., resistance and space). Previous approaches may require multiple optimization operations, e.g., optimization of liners and barriers, and optimization of fill and polish approaches. Previous approaches may also be associated with multiple depositions that take time and can be challenging to implement to achieve thin liner and barrier layers.

In particular embodiments described herein, as an exemplary implementation, two dimensional (2D) crystals are that are atomically thin are formed to prevent Cu diffusion. By exposing Cu to a gas, such as a forming gas ($N_2/H_2$), 2D materials can be formed at the Cu interface. Through such a self-forming barrier approach, there is no need to separately deposit a liner or barrier, since the formed 2D Cu crystal can be used as a barrier.

Advantages of implementing embodiments described herein include using a self-forming barrier method to remove a need to deposit a liner or barrier. A barrier can form solely using a fill metal (e.g., Cu) upon exposure to a gas such as a forming gas. Embodiments may be implemented to minimize space and resistance at the bottom of a via and sidewalls of interconnects. Embodiments may be implemented to create a thin 2D barrier.

To provide context, FIG. 1 illustrates a cross-sectional view of an interconnect structure.

Referring to FIG. 1, an ILD material 102 is above a substrate 100. An interconnect structure 104/106 is in the ILD material 102. The interconnect structure 104/106 can include a conductive line 104 above a conductive via 106. The interconnect structure 104/106 includes a liner 108, a barrier 110 and a conductive fill 112.

Figure 2:
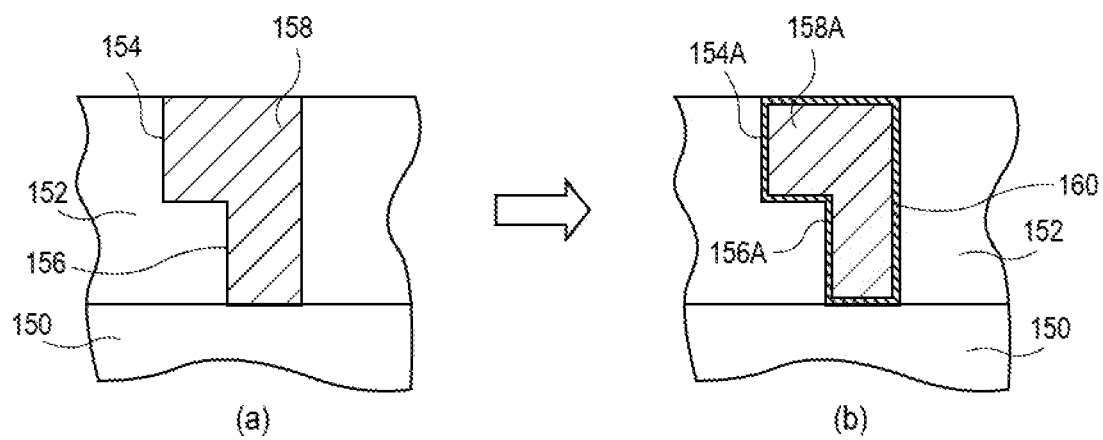
FIG. 2 illustrates cross-sectional views of the formation of an interconnect structure having a linerless self-forming barrier, in accordance with an embodiment of the present disclosure.

In contrast to FIG. 1, FIG. 2 illustrates cross-sectional views of the formation of an interconnect structure having a linerless self-forming barrier, in accordance with an embodiment of the present disclosure.

Referring to part (a) of FIG. 2, an ILD material 152 is above a substrate 150. An interconnect structure 154/156 is in the ILD material 152. The interconnect structure 154/156 can include a conductive line 154 above a conductive via 156. The interconnect structure 154/156 includes a conductive fill 158. In one embodiment, the conductive fill 158 is a copper fill.

Referring to part (b) of FIG. 2, the structure of part (a) is treated to form an interconnect structure 154A/156A having a treated fill 158A and a 2D crystalline liner or barrier 160. In an exemplary embodiment, the 2D crystalline liner or barrier 160 is formed by annealing the structure of part (a) of FIG. 2 in a growth gas (e.g., a forming gas ($N_2/H_2$) exposure at a temperature of approximately 45 C for a duration of approximately 1 hour). In one embodiment, the 2D crystalline liner or barrier 160 is a Cu barrier formed using only the Cu present in the conductive fill 158.

With reference again to part (b) of FIG. 2, in accordance with an embodiment of the present disclosure, an integrated circuit structure includes a dielectric material 152 above a substrate 150. An interconnect structure 154A/156A is in a trench in the dielectric material 152. The interconnect structure 154A/156A includes a conductive fill material 158A and a two-dimensional (2D) crystalline liner 160. The 2D crystalline liner 160 is in direct contact with the dielectric material 152 and with the conductive fill material 158A. The 2D crystalline liner 160 includes a same metal species as the conductive fill material 158A.

In one embodiment, the 2D crystalline liner 160 is a monolayer. In one embodiment, the 2D crystalline liner 160 has a thickness of less than 5 nanometers.

In one embodiment, the metal species is copper. In one embodiment, the metal species is cobalt. In one embodiment, the metal species is tungsten.

In one embodiment, the 2D crystalline liner 160 is further on a top surface of the interconnect structure 154A/156A, as is depicted. In one embodiment, the interconnect structure 154A/156A includes a conductive line 154A on a conductive via 156A.

In another aspect, a 2D crystalline liner is included in a conductive contact. As an exemplary structure, FIG. 3A illustrates a cross-sectional of a thin film integrated circuit structure having a linerless self-forming barrier, in accordance with an embodiment of the present disclosure.

Figure 3A:
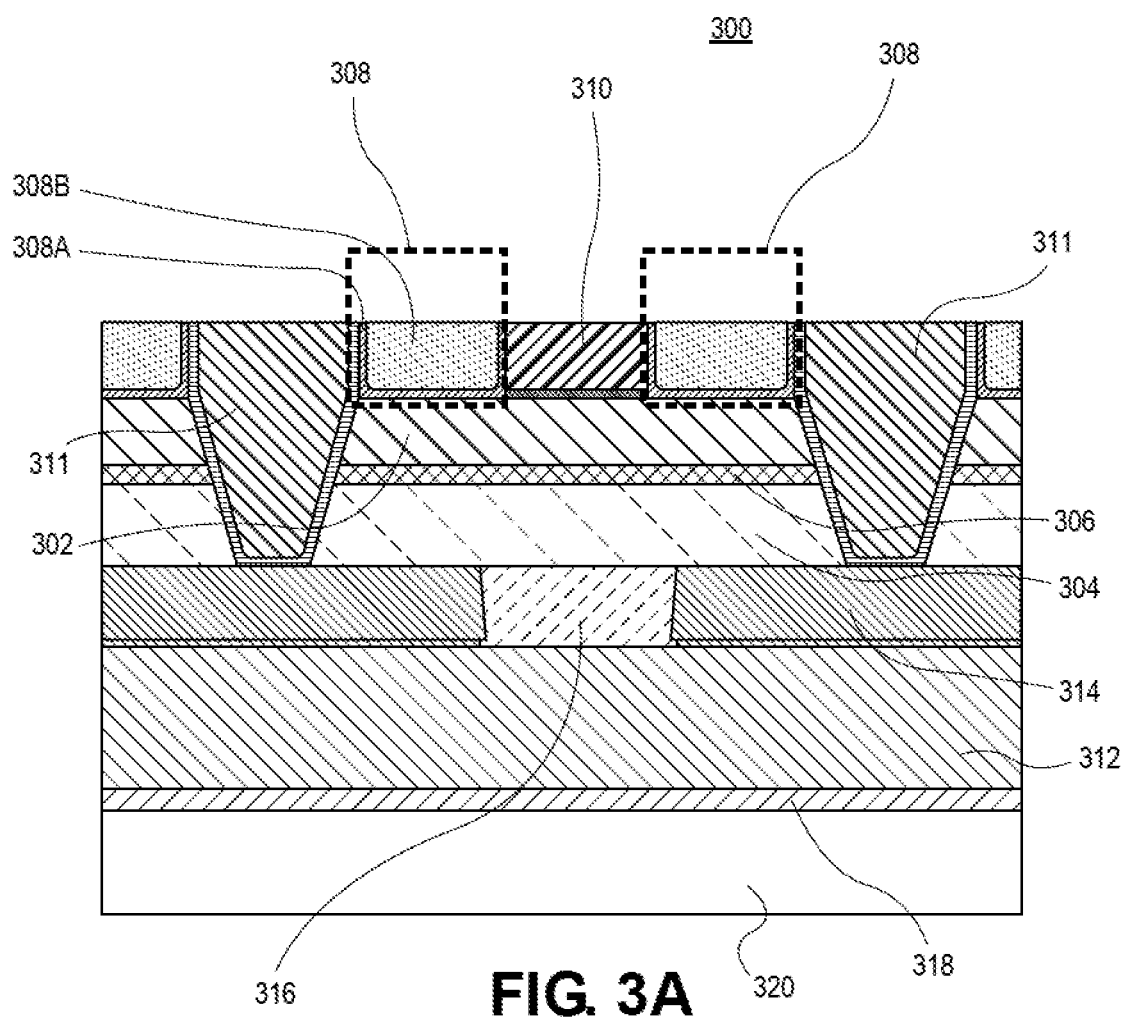
FIG. 3A illustrates a cross-sectional of a thin film integrated circuit structure having a linerless self-forming barrier, in accordance with an embodiment of the present disclosure.

Referring to FIG. 3A, an integrated circuit structure 300 includes a semiconducting oxide material 302 over a gate electrode 304. A pair of conductive contacts 308 (as shown in the dashed boxes) is directly on a first region of the semiconducting oxide material 302. A second region of the semiconducting oxide material 302 is between the pair of conductive contacts 308. The second region of the semiconducting oxide material 302 may include or may be included in a channel region for a thin film transistor.

In an embodiment, the integrated circuit structure 300 further includes a gate dielectric layer 306 between the gate electrode 304 and the semiconducting oxide material 302. In one such embodiment, the gate dielectric layer 306 is or includes a layer of a high-k dielectric material directly on the semiconducting oxide material 302, as is depicted.

An insulating structure 310, such as an inter-layer dielectric layer, is included between each of the pair of conductive contacts 308. The insulating structure 310 is over, and may be directly on the second region of the semiconducting oxide material 302. Isolation structures 311 may be included on either side of the pair of conductive contacts 308, as is depicted. The isolation structures 311 may include one or more dielectric layers.

In an embodiment, the gate electrode 304 is a bottom gate electrode over a conductive line 312, such as an interconnect line. In one embodiment, an etch stop layer 314 is between the gate electrode 304 and the conductive line 312. A conductive via 316 is in an opening in the etch stop layer 314 and electrically couples the gate electrode 304 to the conductive line 312, as is depicted. The conductive line 312 may be formed above additional etch stop layers 318 and/or inter-layer dielectric (ILD) layers 320, such as low-k ILD layers.

In accordance with an embodiment of the present disclosure, each of the pair of conductive contacts 308 includes a conductive fill material 308B and a two-dimensional (2D) crystalline liner 308A. The 2D crystalline liner 308A is in direct contact with the semiconducting oxide material 302 and with the conductive fill material 308B. The 2D crystalline liner 308A includes a same metal species as the conductive fill material 308B.

In one embodiment, the 2D crystalline liner 308A is a monolayer. In one embodiment, the 2D crystalline liner 308A has a thickness of less than 5 nanometers. In one embodiment, although not depicted, the 2D crystalline liner 308A is further on a top surface of the conductive fill material 308B.

In one embodiment, the metal species is copper. In one embodiment, the metal species is cobalt. In one embodiment, the metal species is tungsten.

In an embodiment, the semiconducting oxide material 302 includes a material selected from the group consisting of indium gallium zinc oxide, tin oxide, antimony oxide, indium oxide, indium tin oxide, titanium oxide, zinc oxide, indium zinc oxide, gallium oxide, titanium oxynitride, ruthenium oxide and tungsten oxide.

Figure 3B:
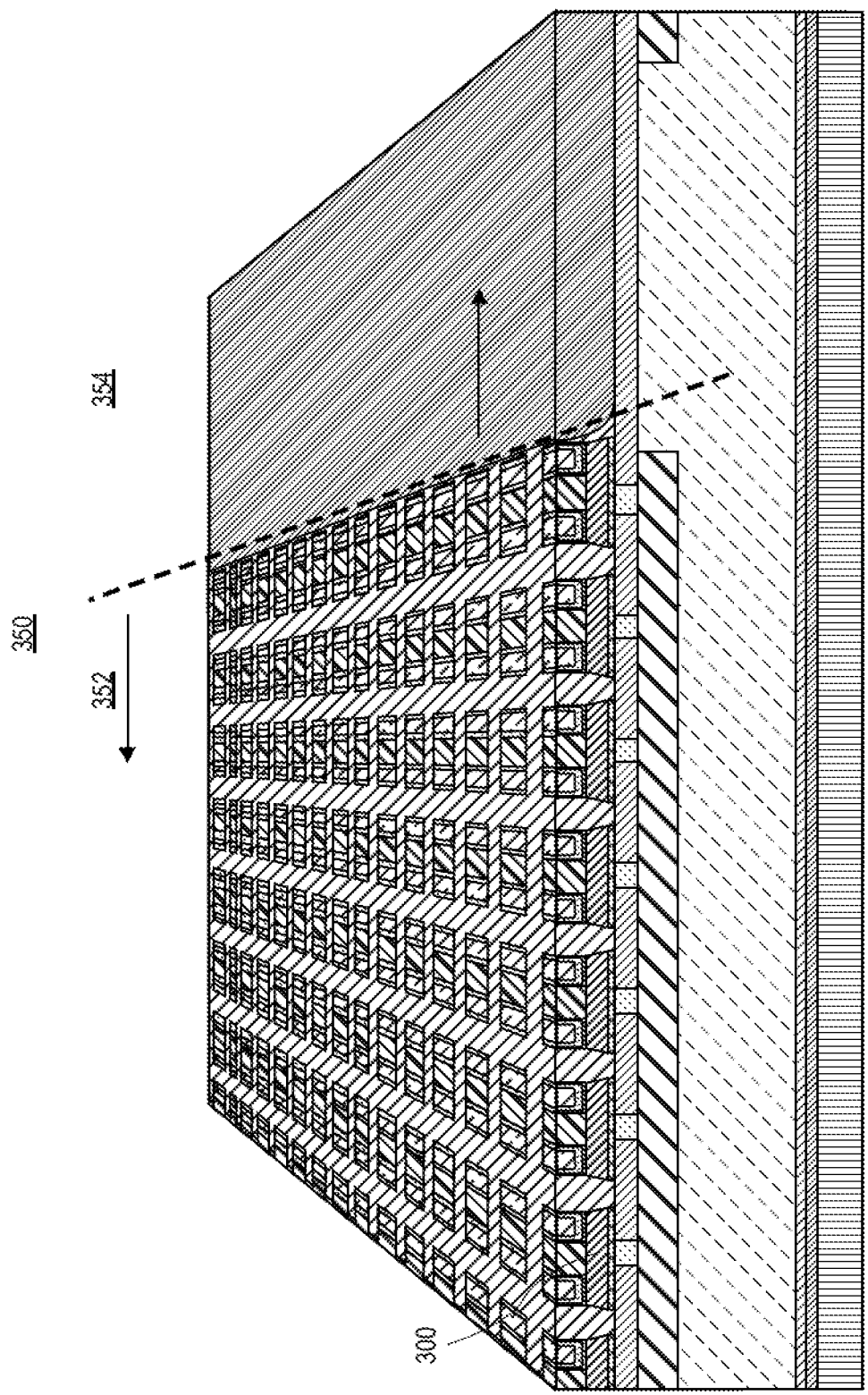
FIG. 3B illustrates an angled sectional view of an array of thin film integrated circuit structures having a linerless self-forming barrier, the array adjacent a logic area, in accordance with an embodiment of the present disclosure.

As an exemplary arrangement of a plurality of integrated circuit structures of the type of FIG. 3A, FIG. 3B illustrates an angled sectional view of an array of thin film integrated circuit structures having a linerless self-forming barrier, the array adjacent a logic area, in accordance with an embodiment of the present disclosure. Referring to FIG. 3B, a layout 350 includes a thin film transistor array 352 adjacent a logic area 354. Each of the thin film transistors of the thin film transistor array 352 may be like or similar to integrated circuit structure 300 described in association with FIG. 3A.

In another aspect, there is increased need for advanced SoCs to include monolithically integrated BEOL transistors for logic functionality at higher metal layers. Such BEOL transistors typically have a lower thermal budget than front-end transistors due to increased thermal sensitivity of back-end materials. Also, the performance of such transistors may be severely hampered due to low channel mobility for BEOL-compatible channel materials such as IGZO (indium gallium zinc oxide).

In accordance with one or more embodiments described herein, non-planar BEOL-compatible thin film transistors (TFTs) are fabricated by effectively increasing the transistor width (and hence the drive strength and performance) for a given projected area. A TFT fabricated using such an architecture may exhibit an increase in gate control, stability, and performance of thin film transistors. Applications of such systems may include, but are not limited to, back-end (BEOL) logic, memory, or analog applications. Embodiments described herein may include non-planar structures that effectively increase transistor width (relative to a planar device) by integrating the devices in unique architectures.

Figure 4A:
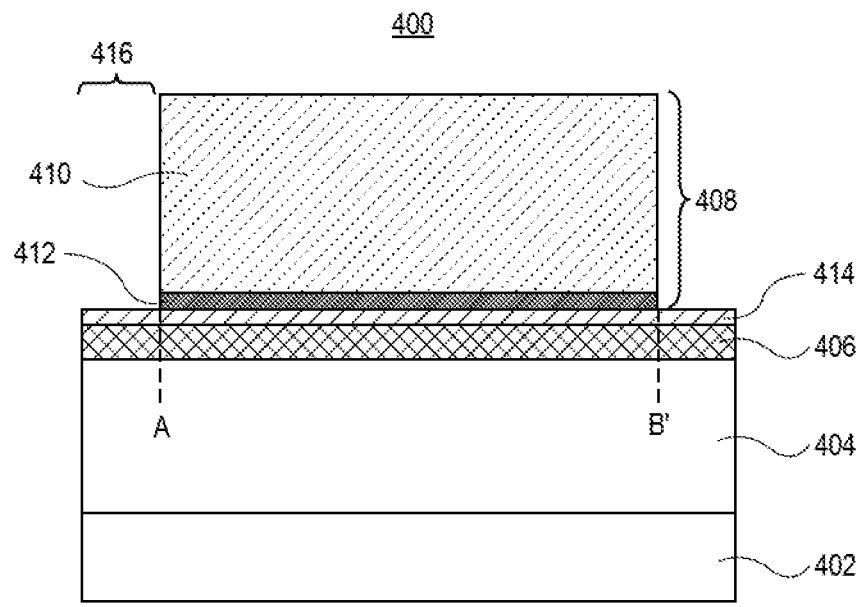
FIG. 4A illustrates a cross-sectional view taken along a gate "width" of a planar thin film integrated circuit structure having a linerless self-forming barrier, in accordance with an embodiment of the present disclosure.

To provide a benchmark, FIG. 4A illustrates a cross-sectional view taken along a gate "width" of a planar thin film integrated circuit structure having a linerless self-forming barrier, in accordance with an embodiment of the present disclosure.

Referring to FIG. 4A, a planar TFT 400 is formed above a substrate 402, e.g., on an insulating layer 404 above a substrate, as is shown. The planar TFT 400 includes a channel material 406, such as a semiconducting oxide material. A gate electrode 408 is formed on a gate dielectric layer 414 formed on the channel material 406. The gate electrode 408 may include a fill material 410 on a workfunction layer 412, as is depicted. The gate electrode 408 may expose regions 416 of the channel material 406 and the gate dielectric layer 414, as is depicted. Alternatively, the channel material 406 and the gate dielectric layer 414 have a same lateral dimension as the gate electrode 408. It is to be appreciated that source/drain regions are into and out of the page of the view of FIG. 4A.

The planar TFT 400 has an effective gate width that is the length of the planar channel material 406 between locations A and B', as depicted in FIG. 4A. The TFT 400 may be referred to herein as a planar BEOL field effect transistor (FET).

Figure 4B:
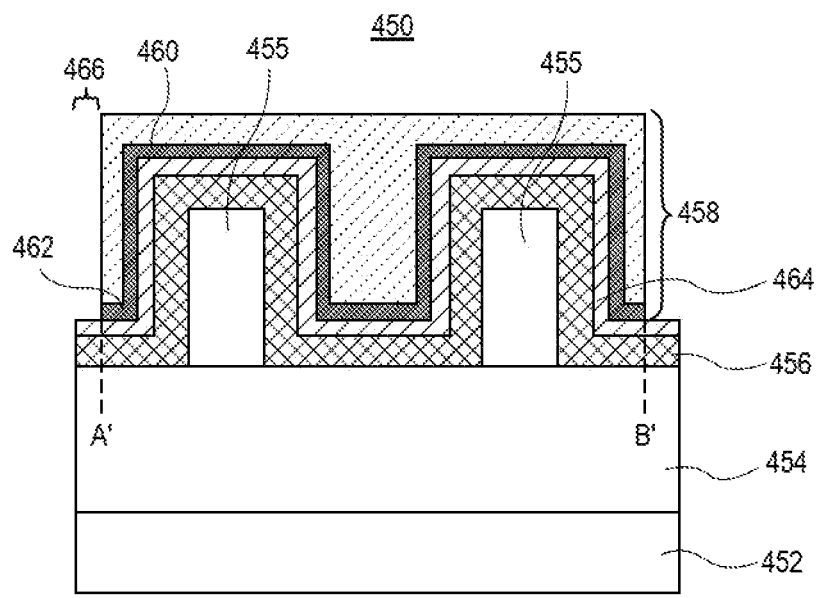
FIG. 4B illustrates a cross-sectional view taken along a gate "width" of a thin film integrated circuit structure having relatively increased width and a linerless self-forming barrier, in accordance with an embodiment of the present disclosure.

As a first example of a structure having relative increase in transistor width (e.g., relative to the structure of FIG. 4A), FIG. 4B illustrates a cross-sectional view taken along a gate "width" of a thin film integrated circuit structure having relatively increased width and a linerless self-forming barrier, in accordance with an embodiment of the present disclosure.

Referring to FIG. 4B, a non-planar TFT 450 is formed above a substrate 452, e.g., on an insulating layer 454 above a substrate, as is shown. A pair of dielectric fins 455 is on the insulating layer 454. The non-planar TFT 450 includes a semiconducting oxide material 456, or similarly suitable channel material. The semiconducting oxide material 456 is conformal with the pair of dielectric fins 455 and with exposed portions of the insulating layer 454 between the pair of dielectric fins 455. A gate electrode 458 is formed on a gate dielectric layer 464 formed on the semiconducting oxide material 456. The gate electrode 458 may include a fill material 460 on a workfunction layer 462, as is depicted. The gate electrode 458 may expose regions 466 of the semiconducting oxide material 456 and the gate dielectric layer 464, as is depicted. Alternatively, the semiconducting oxide material 456 and the gate dielectric layer 464 have a same lateral dimension as the gate electrode 458. It is to be appreciated that source/drain regions are into and out of the page of the view of FIG. 4B.

The non-planar TFT 450 has an effective gate width that is the length of the conformal semiconducting oxide material 456 between locations A' and B', i.e., the full length including undulating portions over the tops and sidewalls of the dielectric fins 455, as is depicted in FIG. 4B. The TFT 450 may be referred to herein as a non-planar BEOL field effect transistor (FET). In comparison to FIG. 4A, the structure of FIG. 4B highlights the advantage of a non-planar architecture to increase effective gate width, referred to herein as a relatively increased width.

To highlight other aspects of a non-planar TFT topography, FIGS. 4C, 4D, and 4E illustrate angled and direct cross-sectional views of a thin film integrated circuit structure having relatively increased width and a linerless self-forming barrier, in accordance with an embodiment of the present disclosure. It is to be appreciated that one dielectric fin is illustrated in FIGS. 4C-4E for simplification. Embodiments may include a single device fabricated over one (FIG. 4C), two (FIG. 4B) or more such dielectric fins.

Referring to FIGS. 4C-4E, an integrated circuit structure 470 includes a dielectric fin 455 on an insulator layer 454 above a substrate 452. The dielectric fin 455 has a top and sidewalls. A semiconducting oxide material 456, or similarly suitable channel material, is on the top and sidewalls of the dielectric fin 455. A gate electrode 458 is over a first portion of the semiconducting oxide material 456 on the top and sidewalls of the dielectric fin 455. The gate electrode 458 has a first side opposite a second side. A first conductive contact (left 474) is adjacent the first side of the gate electrode 458, over a second portion of the semiconducting oxide material 456 on the top and sidewalls of the dielectric fin 455. A second conductive contact (right 474) is adjacent the second side of the gate electrode 458, over a third portion of the semiconducting oxide material 456 on the top and sidewalls of the dielectric fin 455. In an embodiment, the first and second conductive contacts 474 each include a conductive fill material and a two-dimensional (2D) crystalline liner, where the 2D crystalline liner includes a same metal species as the conductive fill material, such as the arrangement described in association with FIG. 3A.

In an embodiment, the integrated circuit structure 470 further includes a gate dielectric layer 464 between the gate electrode 458 and the first portion of the semiconducting oxide material 456 on the top and sidewalls of the dielectric fin 455, as is depicted in FIGS. 4C-4E. In an embodiment, the integrated circuit structure 470 further includes a first dielectric spacer (left 472) between the first conductive contact 474 and the first side of the gate electrode 458, the first dielectric spacer 472 over a fourth portion of the semiconducting oxide material 456 on the top and sidewalls of the dielectric fin 455. A second dielectric spacer (right 472) is between the second conductive contact 474 and the second side of the gate electrode 458, the second dielectric spacer 472 over a fifth portion of the second semiconducting oxide material 456 on the top and sidewalls of the dielectric fin 455, as is depicted in FIGS. 4C and 4E. In one such embodiment, the gate dielectric layer 464 is further along the first and second dielectric spacers 472, as is also depicted in FIGS. 4C and 4E.

Referring collectively to FIGS. 4B-4E, in accordance with an embodiment of the present disclosure, an integrated circuit structure 450 or 470 includes an insulator structure 455 above a substrate 452. The insulator structure 455 has a topography that varies along a plane (ab) parallel with a global plane of the substrate 452. A semiconducting oxide material 456 is on the insulator structure 455. The semiconducting oxide material 456 is conformal with the topography of the insulator structure 455. A gate electrode 458 is over a first portion of the semiconducting oxide material 456 on the insulator structure 455. The gate electrode 458 has a first side opposite a second side. A first conductive contact (left 474) is adjacent the first side of the gate electrode 458. The first conductive contact 474 is over a second portion of the semiconducting oxide material 456 on the insulator structure 455. A second conductive contact (right 474) is adjacent the second side of the gate electrode 458. The second conductive contact 474 is over a third portion of the semiconducting oxide material 456 on the insulator structure 455.

In an embodiment, the insulator structure 450 or 470 includes one or more dielectric fins 455. Individual ones of the dielectric fins 455 have a top and sidewalls. The semiconducting oxide material 456 is on the top and sidewalls of the individual ones of the dielectric fins 455. In an embodiment, the insulator structure 455 (such as fin or fins 455) is composed of a dielectric material such as, but not limited to, silicon dioxide, silicon oxy-nitride, silicon nitride, or carbon-doped silicon nitride. In an embodiment, the insulator structure 455 is composed of a low-k dielectric material.

In an embodiment, dielectric fins described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have dielectric fins spaced at a constant pitch and having a constant width. The pattern may be fabricated by a pitch halving or pitch quartering, or other pitch division, approach. In an embodiment, the dielectric fin or fins 455 each have squared-off (as shown) or rounder corners.

In an embodiment, a gate dielectric layer 464 is between the gate electrode 458 and the first portion of the semiconducting oxide material 456 on the insulator structure 455, as is depicted. In one such embodiment, the gate dielectric layer 464 includes a layer of a high-k dielectric material directly on the semiconducting oxide material 456.

In an embodiment, a first dielectric spacer (first 472) is between the first conductive contact (first 474) and the first side of the gate electrode 458, the first dielectric spacer (first 472) over a fourth portion of the semiconducting oxide material 456 on the insulator structure 455. A second dielectric spacer (second 472) is between the second conductive contact (second 474) and the second side of the gate electrode 458, the second dielectric spacer (second 472) over a fifth portion of the semiconducting oxide material 456 on the insulator structure 455. In one such embodiment, a gate dielectric layer 464 is between the gate electrode 458 and the first portion of the semiconducting oxide material 456 on the insulator structure 455. The gate dielectric layer 464 is further along the first dielectric spacer (first 472) and the second dielectric spacer (second 472). In a specific such embodiment, the gate dielectric layer 464 includes a layer of a high-k dielectric material directly on the semiconducting oxide material 456.

In an embodiment, the semiconducting oxide material 456 includes indium gallium zinc oxide (IGZO). In an embodiment, the semiconducting oxide material 456 includes a material selected from the group consisting of tin oxide, antimony oxide, indium oxide, indium tin oxide, titanium oxide, zinc oxide, indium zinc oxide, gallium oxide, titanium oxynitride, ruthenium oxide and tungsten oxide. In an embodiment, the gate dielectric layer 464 includes a layer of a high-k dielectric material directly on the semiconducting oxide material 456. In an alternative embodiment, the channel material is not a semiconducting oxide material but is rather a layer of polycrystalline silicon.

Figure 5A:
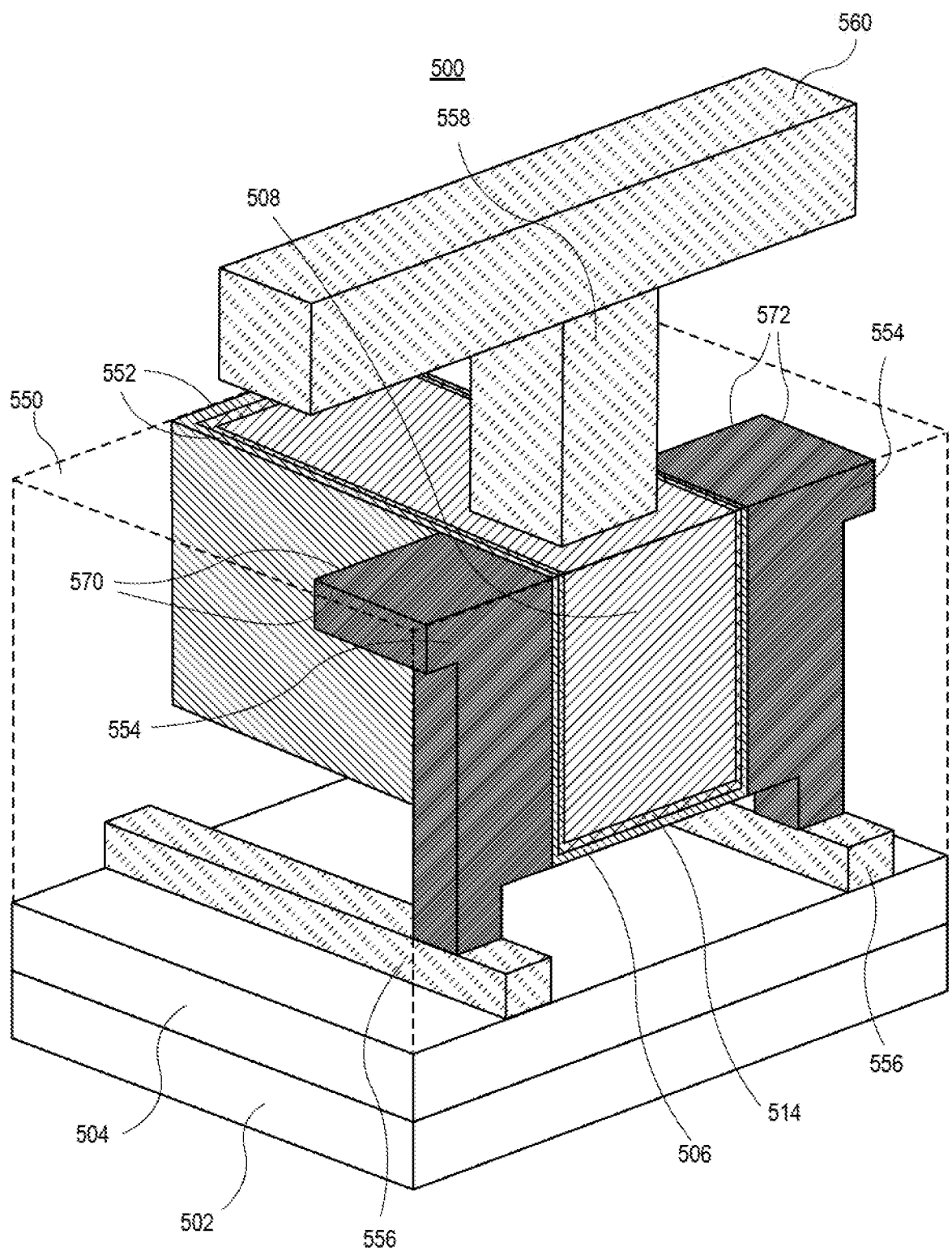
FIG. 5A illustrates an angled three-dimensional view of another thin film integrated circuit structure having relatively increased width and a linerless self-forming barrier, in accordance with another embodiment of the present disclosure.
Figure 5B:
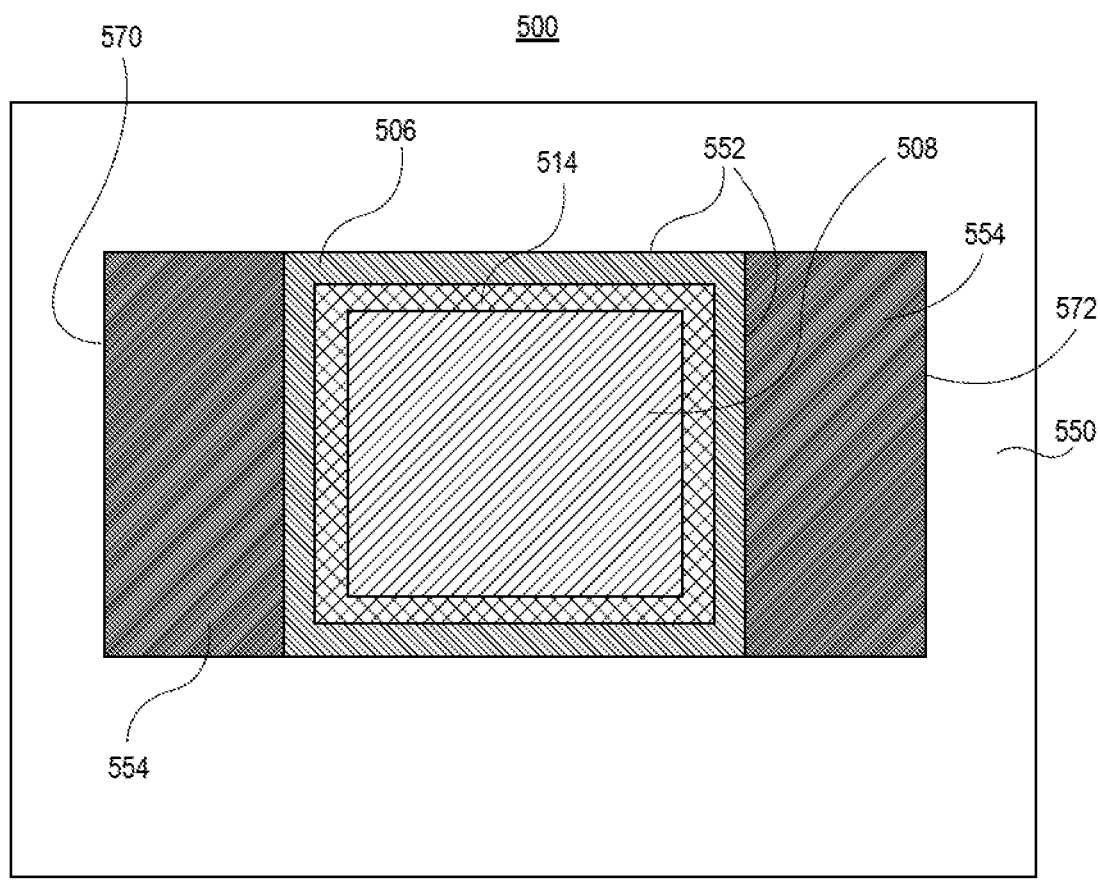
FIG. 5B illustrates a top-down view of a portion of the thin film integrated circuit structure of FIG. 5A, in accordance with another embodiment of the present disclosure.

As a second example of a structure having relative increase in transistor width, FIG. 5A illustrates an angled three-dimensional view of another thin film integrated circuit structure having relatively increased width and a linerless self-forming barrier, in accordance with another embodiment of the present disclosure. FIG. 5B illustrates a top-down view of a portion of the thin film integrated circuit structure of FIG. 5A.

Referring to FIGS. 5A and 5B, an integrated circuit structure 500 includes an insulator structure 550 above a substrate 502. The insulator structure 550 may be formed on an insulator layer 504, as is depicted. The insulator structure 550 has a first trench 552 therein, the first trench 552 having sidewalls and a bottom. A semiconducting oxide material 506, or similarly suitable channel material, is in the first trench 552 in the insulator structure 550. The semiconducting oxide material 506 is conformal with the sidewalls and bottom of the first trench 552. A gate dielectric layer 514 is on the semiconducting oxide material 506 in the first trench 552. The gate dielectric layer 514 is conformal with the semiconducting oxide material 506 conformal with the sidewalls and bottom of the first trench 552. A gate electrode 508 is on the gate dielectric layer 514 in the first trench 552. The gate electrode 508 has a first side opposite a second side and has an exposed top surface. A first conductive contact (left 554) is laterally adjacent the first side of the gate electrode 508. The first conductive contact (left 554) is on a first portion of the semiconducting oxide material 506 conformal with the sidewalls of the first trench 552. A second conductive contact (right 554) is laterally adjacent the second side of the gate electrode 508. The second conductive contact (right 554) is on a second portion of the semiconducting oxide material 506 conformal with the sidewalls of the first trench 552. It is to be appreciated that the conductive contacts 554 are shown only at the front portion of the first trench 552 for clarity of the drawing. In an embodiment, the conductive contacts 554 extend all the way, or substantially all the way along the first trench 552 for maximized source/drain contact area and maintain a relatively small effective gate length. In an embodiment, the first and second conductive contacts 554 each include a conductive fill material and a two-dimensional (2D) crystalline liner, where the 2D crystalline liner includes a same metal species as the conductive fill material, such as the arrangement described in association with FIG. 3A.

In an embodiment, the insulator structure 550 is a single layer of ILD material, as is depicted. In another embodiment, the insulator structure 550 is a stack of alternating dielectric layers, such as described in association with FIGS. 7A-7H.

In an embodiment, a third conductive contact 558 is over and in contact with the exposed top surface of the gate electrode 508, as is depicted. In an embodiment, the first conductive contact (left 554) is in a second trench 570 in the insulator structure 550, and the third conductive contact (right 554) is in a third trench 572 in the insulator structure 550, as is depicted. In an embodiment, the third conductive contact 558 is coupled to a conductive line 560, which may be a word line, as is depicted. In an embodiment, the first and second conductive contacts 554 are coupled corresponding conductive lines 556, as is depicted.

Referring again to FIG. 5, in an embodiment, a non-planar back-end FET architecture uses the vertical length (depth) of the first trench 552 to increase effective width of the transistor. That is, the depth of the first trench 552 is the Z of the TFT, where the effective width (Weff) is relatively increased by setting Z to the depth of the trench.

In an embodiment, the semiconducting oxide material 506 includes indium gallium zinc oxide (IGZO). In an embodiment, the semiconducting oxide material 506 includes a material selected from the group consisting of tin oxide, antimony oxide, indium oxide, indium tin oxide, titanium oxide, zinc oxide, indium zinc oxide, gallium oxide, titanium oxynitride, ruthenium oxide and tungsten oxide. In an embodiment, the gate dielectric layer 514 includes a layer of a high-k dielectric material directly on the semiconducting oxide material 506. In an alternative embodiment, the channel material is not a semiconducting oxide material but is rather a layer of polycrystalline silicon.

Figure 6:
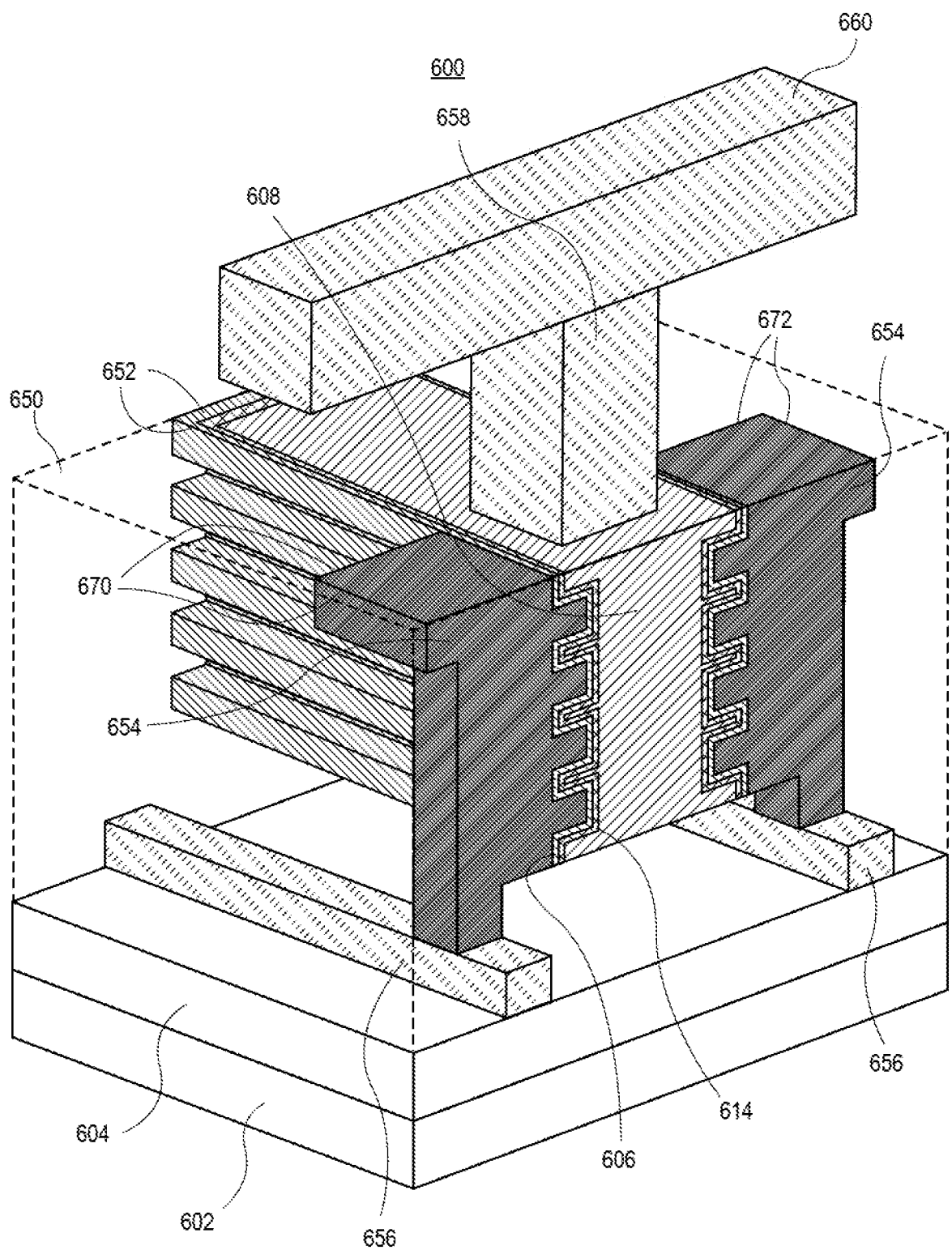
FIG. 6 illustrates an angled three-dimensional view of another thin film integrated circuit structure having relatively increased width and a linerless self-forming barrier, in accordance with another embodiment of the present disclosure.

As a third example of a structure having relative increase in transistor width, FIG. 6 illustrates an angled three-dimensional view of another thin film integrated circuit structure having relatively increased width and a linerless self-forming barrier, in accordance with another embodiment of the present disclosure.

Referring to FIG. 6, an integrated circuit structure 600 includes an insulator structure 650 above a substrate 602. The insulator structure 650 may be formed on an insulator layer 604, as is depicted. The insulator structure 650 has a first trench 652 therein, the first trench 652 having sidewalls and a bottom. The insulator structure 650 has a topography that varies along a plane normal with a global plane of the substrate 602. In one such embodiment, the insulator structure 650 has a corrugated topography that varies along a plane normal with a global plane of the substrate 602, as is depicted. In a specific such embodiment, the corrugated topography is within a single layer of ILD material, as is depicted. In another specific such embodiment, the corrugated topography is within an arrangement of alternating dielectric layers, such as described in association with FIGS. 7A-7H.

A semiconducting oxide material 606, or similarly suitable channel material, is in the first trench 652 in the insulator structure 650. The semiconducting oxide material 606 is conformal with the sidewalls and bottom of the first trench 652, i.e., conformal with the topography of the insulator structure 650. A gate dielectric layer 614 is on the semiconducting oxide material 606 in the first trench 652. The gate dielectric layer 614 is conformal with the semiconducting oxide material 606 conformal with the sidewalls and bottom of the first trench 652. A gate electrode 608 is on the gate dielectric layer 614 in the first trench 652. The gate electrode 608 has a first side opposite a second side and has an exposed top surface. A first conductive contact (left 654) is laterally adjacent the first side of the gate electrode 608. The first conductive contact (left 654) is on a first portion of the semiconducting oxide material 606 conformal with the sidewalls of the first trench 652. A second conductive contact (right 654) is laterally adjacent the second side of the gate electrode 608. The second conductive contact (right 654) is on a second portion of the semiconducting oxide material 606 conformal with the sidewalls of the first trench 652. In an embodiment, the conductive contacts 654 extend all the way, or substantially all the way along the first trench 652 for maximized source/drain contact area and maintain a relatively small effective gate length. In an embodiment, the first and second conductive contacts 654 each include a conductive fill material and a two-dimensional (2D) crystalline liner, where the 2D crystalline liner includes a same metal species as the conductive fill material, such as the arrangement described in association with FIG. 3A.

In an embodiment, a third conductive contact 658 is over and in contact with the exposed top surface of the gate electrode 608, as is depicted. In an embodiment, the first conductive contact (left 654) is in a second trench 670 in the insulator structure 650, and the third conductive contact (right 654) is in a third trench 672 in the insulator structure 650, as is depicted. In an embodiment, the third conductive contact 658 is coupled to a conductive line 660, which may be a word line, as is depicted. In an embodiment, the first and second conductive contacts 654 are coupled corresponding conductive lines 656, as is depicted.

Referring again to FIG. 6, in an embodiment, a non-planar back-end FET architecture uses the vertical length (depth) of the first trench 652, including the additional length provided by the corrugation, to increase effective width of the transistor. That is, the length of the corrugated first trench 652 is the Z of the TFT, where the effective width (Weff) is relatively increased by setting Z to the depth or length along the corrugated first trench 652.

In an embodiment, the semiconducting oxide material 606 includes indium gallium zinc oxide (IGZO). In an embodiment, the semiconducting oxide material 606 includes a material selected from the group consisting of tin oxide, antimony oxide, indium oxide, indium tin oxide, titanium oxide, zinc oxide, indium zinc oxide, gallium oxide, titanium oxynitride, ruthenium oxide and tungsten oxide. In an embodiment, the gate dielectric layer 614 includes a layer of a high-k dielectric material directly on the semiconducting oxide material 606. In an alternative embodiment, the channel material is not a semiconducting oxide material but is rather a layer of polycrystalline silicon.

In accordance with an embodiment of the present disclosure, the above TFT non-planar architectures 450, 470, 500 and 600 provide for higher effective widths for a transistor for a scaled projected area. In an embodiment, the drive strength and performance of such transistors are improved over state-of-the-art planar BEOL transistors.

As an exemplary processing scheme, FIGS. 7A-7H illustrate cross-sectional and plan views of various stages in a method of fabricating a thin film integrated circuit structure having relatively increased width and a linerless self-forming barrier, in accordance with an embodiment of the present disclosure.

Figure 7A:
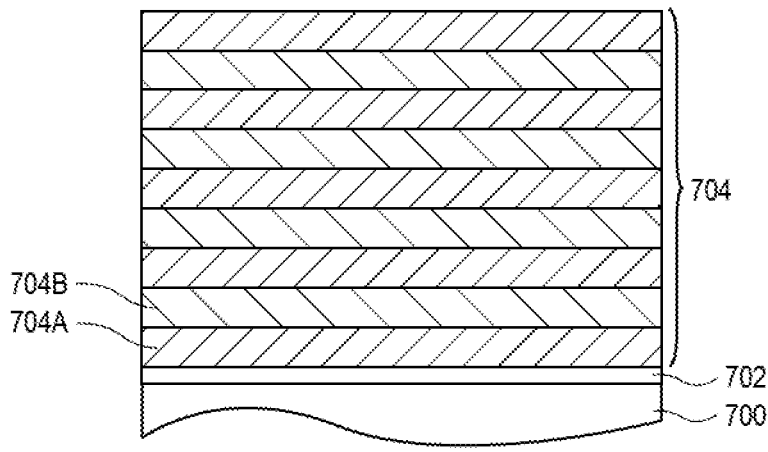
FIGS. 7A-7H illustrate cross-sectional and plan views of various stages in a method of fabricating a thin film integrated circuit structure having relatively increased width and a linerless self-forming barrier, in accordance with an embodiment of the present disclosure.

Referring to FIG. 7A, a stack 704 of dielectric layers is formed above a substrate 700 and, possibly, on an insulating layer 702 formed on or above the substrate 700. The stack 704 of dielectric layers includes alternating dielectric layers 704A and 704B of differing composition. In one embodiment, the stack 704 of dielectric layers is a stack of alternating silicon dioxide and silicon nitride layers.

Figure 7B:
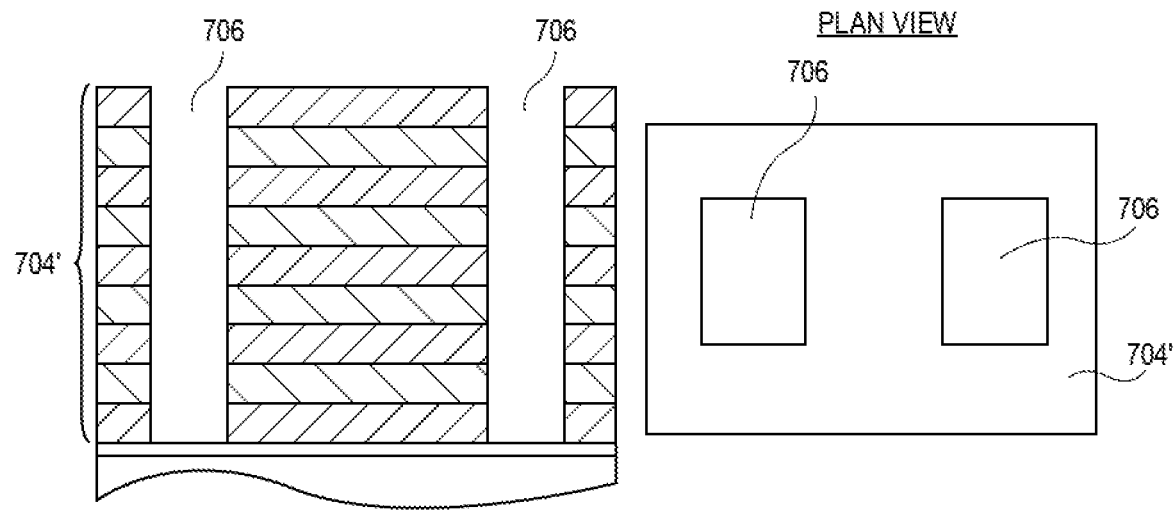

Referring to FIG. 7B, openings 706 are formed in the stack 704 of dielectric layers to form a once-patterned stack 704' of dielectric layers. In one embodiment, the structure of FIG. 7B is used without the process described below in association with FIG. 7C in order to arrive at a structure such as TFT 300.

Figure 7C:
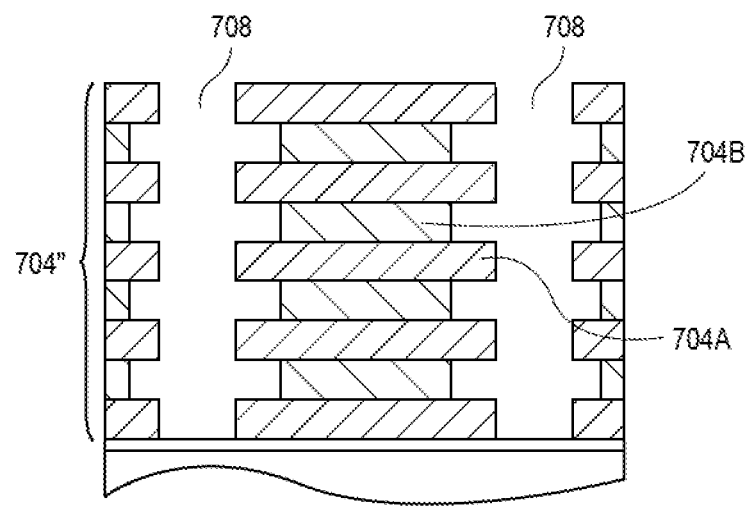

Referring to FIG. 7C, corrugation is achieved to form corrugated openings 708 by exposing the structure of FIG. 7B to an etch process that recesses layers 704B selective to layers 704A. The selective etching process provides twice-patterned stack 704" of dielectric layers. The twice-patterned stack 704" of dielectric layers may be used in order to arrive at a structure such as TFT 400.

Figure 7D:
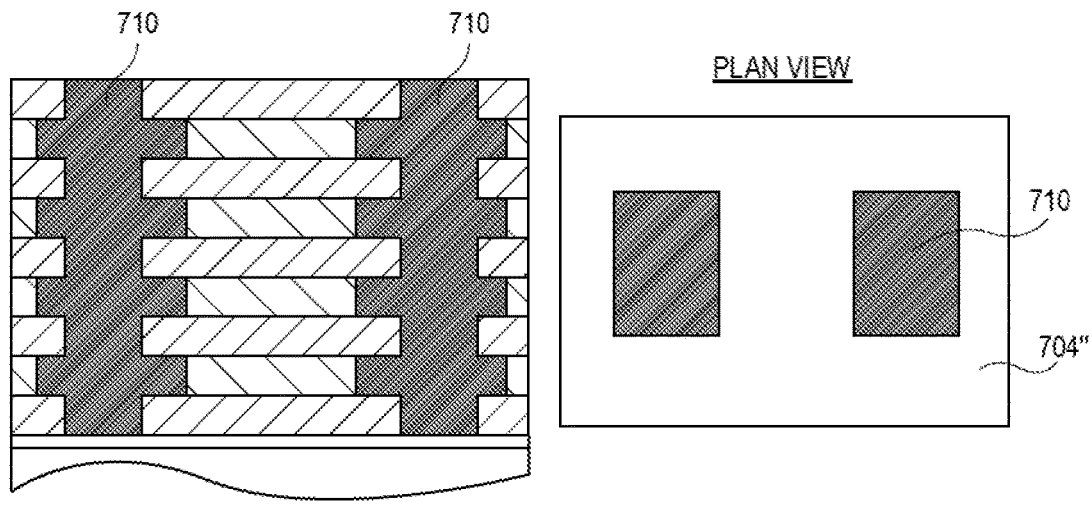

Referring to FIG. 7D, conductive contacts 710, such as source/drain contacts, are formed in the openings 708 of the structure of FIG. 7C. Conductive contacts may be formed, e.g., by a deposition or growth process.

Figure 7E:
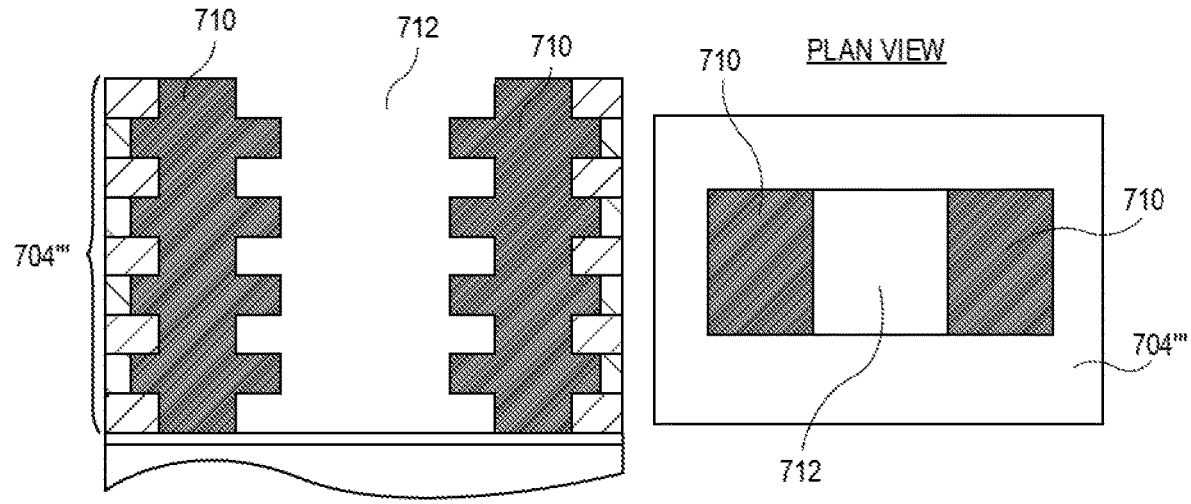

Referring to FIG. 7E, an opening 712 is formed between the conductive contacts 710 to form thrice-patterned stack 704''' of dielectric layers. The opening 712 exposes a corrugated surface of the conductive contacts 710.

Figure 7F:
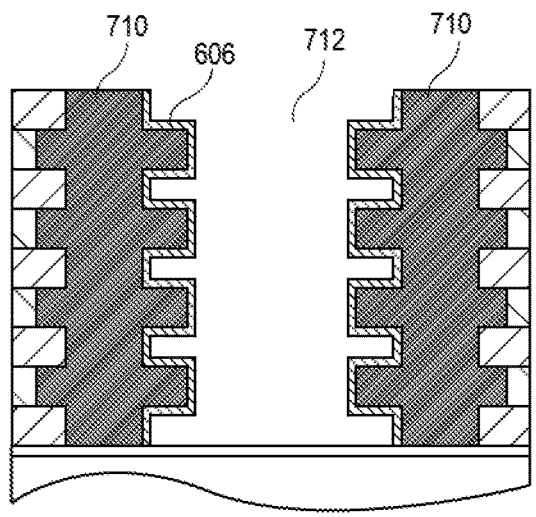

Referring to FIG. 7F, a semiconducting oxide layer 606, or other suitable channel material, is formed in opening 712 along the exposed surfaces of the conductive contacts 710. In an embodiment, the semiconducting oxide layer 606 is formed conformal with the corrugated surface of the conductive contacts 710, as is depicted.

Figure 7G:
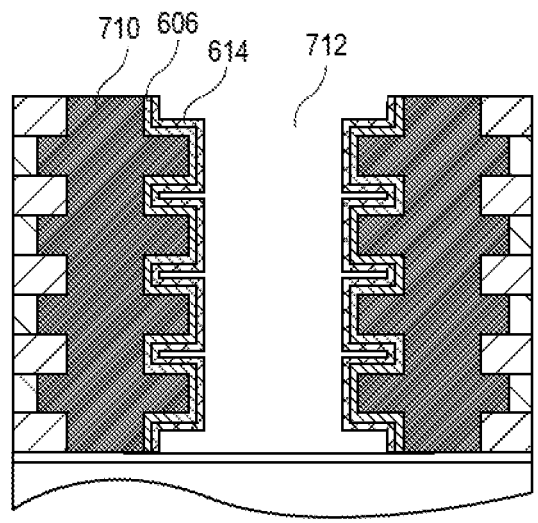

Referring to FIG. 7G, a gate dielectric layer 614 is formed in opening 712. The gate dielectric layer 614 is on and conformal with the semiconducting oxide layer 606.

Figure 7H:
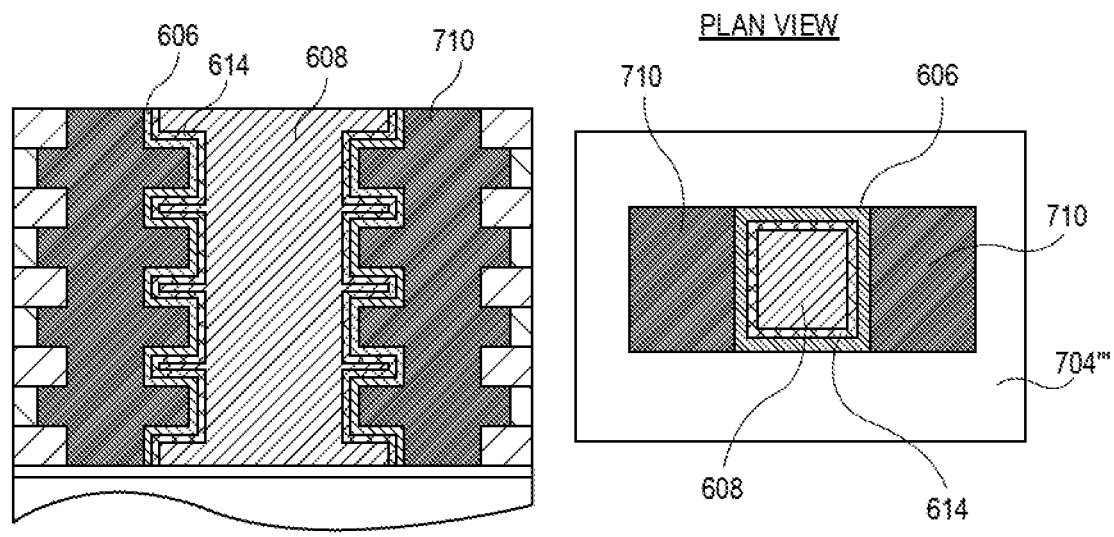

Referring to FIG. 7H, a gate electrode 608 is formed within opening 712. The gate electrode 608 is on and conformal with the gate dielectric layer 614. The structure of FIG. 7G may be included as a portion of the TFT 600 described in association with FIG. 6.

It is to be appreciated that the layers and materials described in association with embodiments herein are typically formed on or above an underlying semiconductor substrate 402, 452, 502, 602, 700 or a substrate beneath ILD layer 120, e.g., as FEOL layer(s). In other embodiments, the layers and materials described in association with embodiments herein are typically formed on or above underlying device layer(s) of an integrated circuit, e.g., as BEOL layer(s) above an underlying semiconductor substrate 402, 452, 502, 602, 700 or a substrate beneath ILD layer 320. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back end of line (BEOL) interconnect layers.

In the case that an insulator layer 454, 504, 604 or 702 is optionally used, the insulator layer 454, 504, 604 or 702 may be composed of a material suitable to ultimately electrically isolate, or contribute to the isolation of, portions of a gate structure from an underlying bulk substrate or interconnect layer. For example, in one embodiment, the insulator layer 454, 504, 604 or 702 is composed of a dielectric material such as, but not limited to, silicon dioxide, silicon oxynitride, silicon nitride, or carbon-doped silicon nitride. In a particular embodiment, the insulator layer 454, 504, 604 or 702 is a low-k dielectric layer of an underlying BEOL layer.

In an embodiment, the semiconducting oxide material 302, 406, 456, 506 or 606 and, hence, channel material of a TFT includes an IGZO layer that has a gallium to indium ratio of 1:1, a gallium to indium ratio greater than 1 (e.g., 2:1, 3:1, 4:1, 5:1, 6:1, 7:1, 8:1, 9:1, or 10:1), or a gallium to indium ratio less than 1 (e.g., 1:2, 1:3, 1:4, 1:5, 1:6, 1:7, 1:8, 1:9, or 1:10). A low indium content IGZO may refer to IGZO having more gallium than indium (e.g., with a gallium to indium ratio greater than 1:1), and may also be referred to as high gallium content IGZO. Similarly, low gallium content IGZO may refer to IGZO having more indium than gallium (e.g., with a gallium to indium ratio less than 1:1), and may also be referred to as high indium content IGZO. In another embodiment, the semiconducting oxide material 302, 406, 456, 506 or 606 is or includes a material such as tin oxide, antimony oxide, indium oxide, indium tin oxide, titanium oxide, zinc oxide, indium zinc oxide, gallium oxide, titanium oxynitride, ruthenium oxide, or tungsten oxide. In an alternative embodiment, polycrystalline silicon is used as the channel material instead of a semiconducting oxide material. In an embodiment, no matter the composition, the channel material has a thickness between 5 nanometers and 30 nanometers.

In an embodiment, the semiconducting oxide material 302, 406, 456, 506 or 606 is an amorphous, crystalline, or semi crystalline oxide semiconductor, such as an amorphous, crystalline, or semi crystalline oxide semiconductor IGZO layer. The semiconducting oxide material 302, 406, 456, 506 or 606 may be formed using a low-temperature deposition process, such as physical vapor deposition (PVD) (e.g., sputtering), atomic layer deposition (ALD), or chemical vapor deposition (CVD). The ability to deposit the semiconducting oxide material 302, 406, 456, 506 or 606 at temperatures low enough to be compatible with back-end manufacturing processes represents a particular advantage. The semiconducting oxide material 302, 406, 456, 506 or 606 may be deposited on sidewalls or conformably on any desired structure to a precise thickness, allowing the manufacture of transistors having any desired geometry.

In an embodiment, gate electrode 304, 408, 458, 508 or 608 includes at least one P-type work function metal or N-type work function metal, depending on whether the integrated circuit device 300, 400, 450, 470, 500 or 600 is to be included in a P-type transistor or an N-type transistor. For a P-type transistors, metals that may be used for the gate electrode 304, 408, 458, 508 or 608 may include, but are not limited to, ruthenium, palladium, platinum, cobalt, nickel, and conductive metal oxides (e.g., ruthenium oxide). For an N-type transistor, metals that may be used for the gate electrode 304, 408, 458, 508 or 608 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode includes a stack of two or more metal layers, where one or more metal layers are work function metal layers and at least one metal layer is a fill metal layer. Further metal layers may be included for other purposes, such as to act as a barrier layer. In some implementations, the gate electrode 304, 408, 458, 508 or 608 may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, gate dielectric layer 306, 414, 464, 514 or 614 is composed of a high-k material. For example, in one embodiment, the gate dielectric layer 306, 414, 464, 514 or 614 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In some implementations, the gate dielectric 306, 414, 464, 514 or 614 may consist of a "U"-shaped structure that includes a bottom portion substantially parallel to the surface of the substrate and two sidewall portions that are substantially perpendicular to the top surface of the substrate, as is depicted in FIGS. 4C and 4E.

In some embodiments, the semiconducting oxide material 302, 406, 456, 506 or 606 is in contact with the gate dielectric layer 306, 414, 464, 514 or 614, respectively, an arrangement which may put an IGZO layer in contact with a high-k metal oxide layer. In other embodiments, an intermediate material is disposed between the semiconducting oxide material 302, 406, 456, 506 or 606 and the gate dielectric layer 306, 414, 464, 514 or 614. In some embodiments, an IGZO layer includes multiple regions of IGZO having different material properties. For example, an IGZO layer may include low indium content IGZO close to (e.g., in contact with) a high-k gate dielectric layer, and a high indium content IGZO close to (e.g., in contact with) the higher mobility semiconducting oxide channel material. High indium content IGZO may provide higher mobility and poorer interface properties relative to low indium content IGZO, while low indium content IGZO may provide a wider band gap, lower gate leakage, and better interface properties, although a lower mobility, relative to high indium content IGZO.

In an embodiment, dielectric spacers 472 are formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used. For example, two pairs, three pairs, or four pairs of sidewall spacers may be formed on opposing sides of the gate electrode 472.

In an embodiment, conductive contacts 308, 474, 554 or 654 act as contacts to source/drain regions of a TFT, or act directly as source/drain regions of the TFT. The conductive contacts 308, 474, 554 or 654 may be spaced apart by a distance that is the gate length of the transistor 300, 400, 450, 470, 500 or 600. In an embodiment, conductive contacts 558 or 658 directly contact a gate electrode. In some embodiments, the gate length is between 7 and 30 nanometers. In an embodiment, the conductive contacts 308, 474, 554, 558, 654 or 658 include one or more layers of metal and/or metal alloys, examples of which are described above in association with FIG. 3A.

In an embodiment, interconnect lines (and, possibly, underlying or overlying via structures), such as interconnect lines 312 (and overlying via 314), 556, 560, 656 or 660, described herein are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Interconnect lines described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, ILD materials described herein, such as ILD materials 550 or 650, are composed of or include a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In one aspect, a gate electrode and gate dielectric layer, e.g., gate electrode 304, 408, 458, 508 or 608 and gate dielectric layer 306, 414, 464, 514 or 614 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structures described herein. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed. The anneal is performed prior to formation of the permanent contacts.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, the performance of a thin film transistor (TFT) may depend on the carrier mobility of the components in the TFT. For example, a material with a higher carrier mobility enables carriers to move more quickly in response to a given electric field than a material with a lower carrier mobility. Accordingly, high carrier mobilities may be associated with improved performance. Although shown and described above as single semiconducting oxide layers, in accordance with embodiments described herein, a layer of a semiconducting oxide, such as a layer of IGZO, is between a high-k gate dielectric material and a higher mobility semiconducting oxide channel material. Although IGZO has a relatively low mobility (approximately 10 cm$^2$/V-s), the sub threshold swing of IGZO may be close to the conventional theoretical lower limit. In some embodiments, a thin layer of IGZO may directly border a channel material of choice, and may be sandwiched between the channel material and the high-k dielectric. The use of IGZO at the interface between the gate stack and the channel may achieve one or more of a number of advantages. For example, an IGZO interface may have a relatively small number of interface traps, defects at which carriers are trapped and released that impede performance. A TFT that includes an IGZO layer as a second semiconducting oxide material may exhibit desirably low gate leakage. When IGZO is used as an interface to a non-IGZO semiconducting oxide channel material (e.g., a thin film oxide semiconductor material having a higher mobility than IGZO), the benefits of the higher mobility channel material may be realized simultaneously with the good gate oxide interface properties provided by the IGZO. In accordance with one or more embodiments described herein, a gate-channel arrangement based on a dual semiconducting oxide layer channel enables the use of a wider array of thin film transistor channel materials, while achieving desirable gate control, than realizable using conventional approaches.

In an embodiment, the addition of a second thin film semiconductor around a first TFT material can provide one or more of mobility enhancement, improved short channel effects (SCEs) particularly if all conduction occurs in the second material. The second TFT material may be selected for strong oxygen bond capability in order to stabilize the TFT when exposed to downstream processing. In accordance with one embodiment, a higher mobility semiconducting oxide material is effectively wrapped in a lower mobility material semiconducting oxide that is more oxygen stable. The resulting structure may limit the negative effects of downstream high temperature processing operations or aggressive operations on the inner TFT material by having the highly stable outer material. An increased set of materials that can be chosen to maximize stability and mobility simultaneously may be achieved using such a dual material architecture.

Figure 8A:
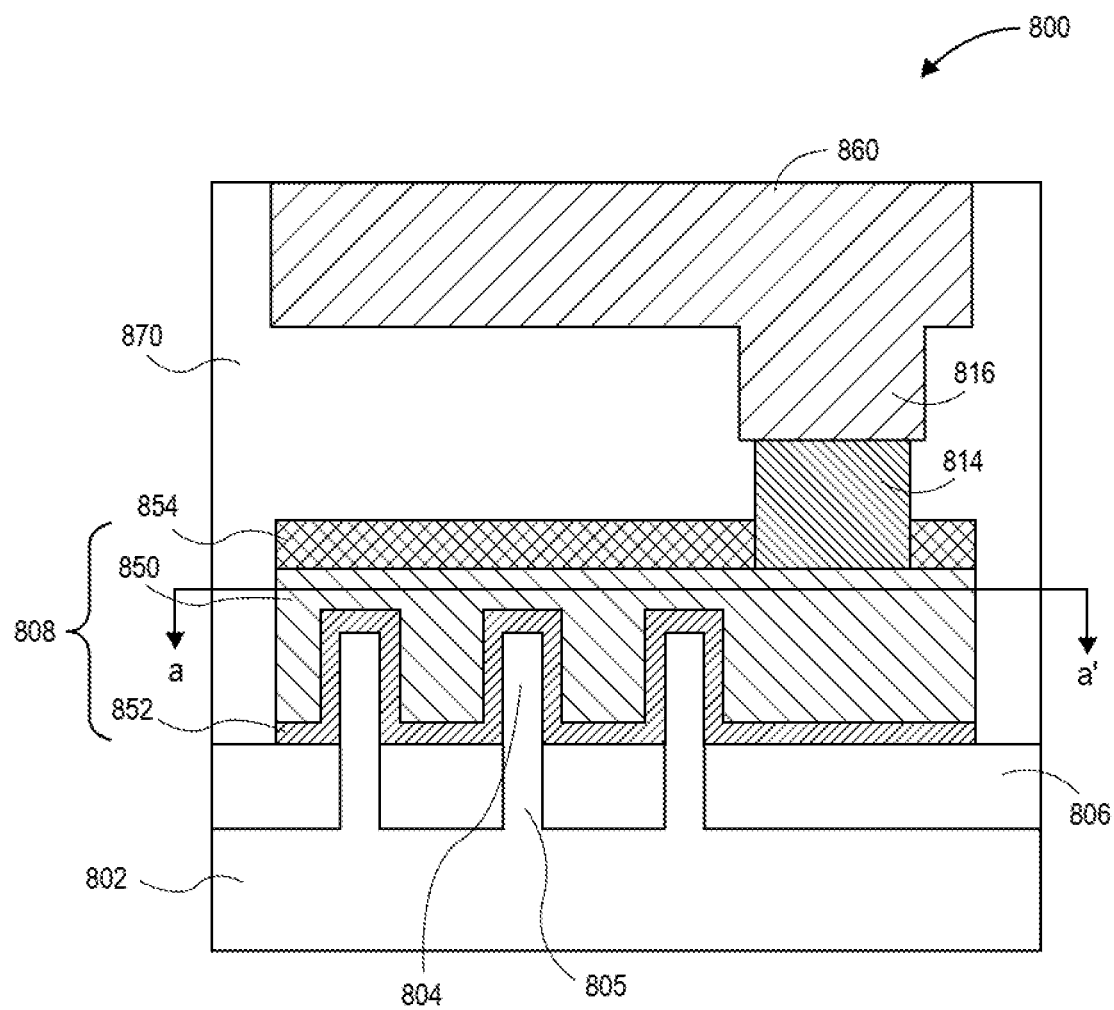
FIG. 8A illustrates a cross-sectional view of a non-planar semiconductor device, in accordance with an embodiment of the present disclosure.
Figure 8B:
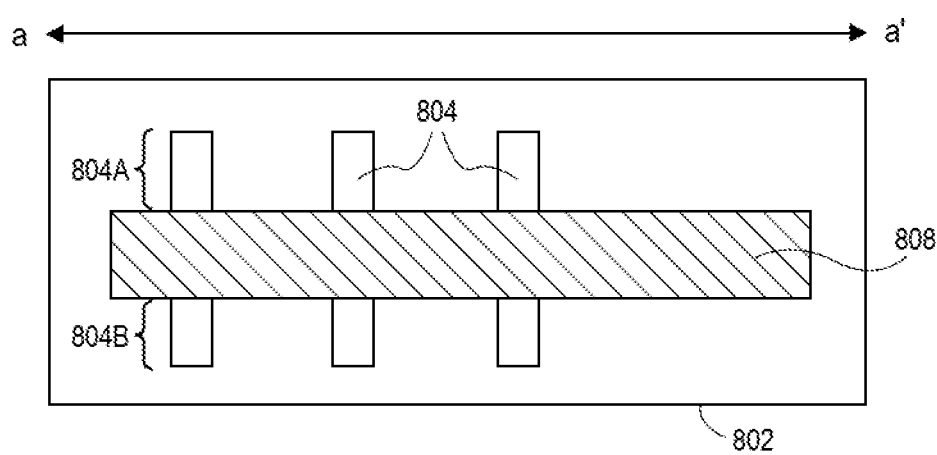
FIG. 8B illustrates a plan view taken along the a-a' axis of the semiconductor device of FIG. 8A, in accordance with an embodiment of the present disclosure.

In another aspect, a 2D crystalline liner is included in a gate electrode structure, e.g., as a workfunction layer of the gate electrode structure. As an example of a completed device as taken through a single gate line, FIG. 8A illustrates a cross-sectional view of a non-planar semiconductor device, in accordance with an embodiment of the present disclosure. FIG. 8B illustrates a plan view taken along the a-a' axis of the semiconductor device of FIG. 8A, in accordance with an embodiment of the present disclosure. Although only one gate line is shown, it is to be appreciated that a plurality of gate lines may be included in an integrated circuit structure.

Referring to FIG. 8A, a semiconductor structure or device 800 includes a non-planar active region (e.g., a fin structure including protruding fin portion 804 and sub-fin region 805) formed from substrate 802, and within isolation region 806. A gate line 808 is disposed over the protruding portions 804 of the non-planar active region as well as over a portion of the isolation region 806. As shown, gate line 808 includes a gate electrode 850 and a gate dielectric layer 852. In one embodiment, gate line 808 may also include a dielectric cap layer 854. A gate contact 814, and overlying gate contact via 816 are also seen from this perspective, along with an overlying metal interconnect 860, all of which are disposed in inter-layer dielectric stacks or layers 870. The gate contact 814 is formed in an opening formed in the dielectric cap layer 854. Also seen from the perspective of FIG. 8A, the gate contact 814 is, in one embodiment, disposed over isolation region 806, but not over the non-planar active regions. In other embodiments, the gate contact 814 is disposed over the non-planar active regions.

In an embodiment, gate electrode 850 includes a conductive fill material and a two-dimensional (2D) crystalline liner. The 2D crystalline liner is in direct contact with the conductive fill material. The 2D crystalline liner includes a same metal species as the conductive fill material. In one such embodiment, the 2D crystalline liner has a different workfunction than the conductive fill material. In a particular such embodiment, the 2D crystalline liner is a workfunction-setting layer of the gate electrode 850. In one embodiment, the 2D crystalline liner is a monolayer. In one embodiment, the 2D crystalline liner has a thickness of less than 5 nanometers. In one embodiment, the metal species is copper. In one embodiment, the metal species is cobalt. In one embodiment, the metal species is tungsten.

Referring to FIG. 8B, the gate line 808 is shown as disposed over the protruding fin portions 804. Source and drain regions 804A and 804B of the protruding fin portions 804 can be seen from this perspective. In one embodiment, the source and drain regions 804A and 804B are doped portions of original material of the protruding fin portions 804. In another embodiment, the material of the protruding fin portions 804 is removed and replaced with another semiconductor material, e.g., by epitaxial deposition. In either case, the source and drain regions 804A and 804B may extend below the height of dielectric layer 806, i.e., into the sub-fin region 805.

In an embodiment, the semiconductor structure or device 800 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 808 surround at least a top surface and a pair of sidewalls of the three-dimensional body.

Referring again to FIG. 8A, the arrangement of semiconductor structure or device 800 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

In another aspect, thin film crystal formation for passivating interconnects is described. To provide context, FIG. 9 illustrates cross-sectional views of the formation of a buried channel structure.

Figure 9:
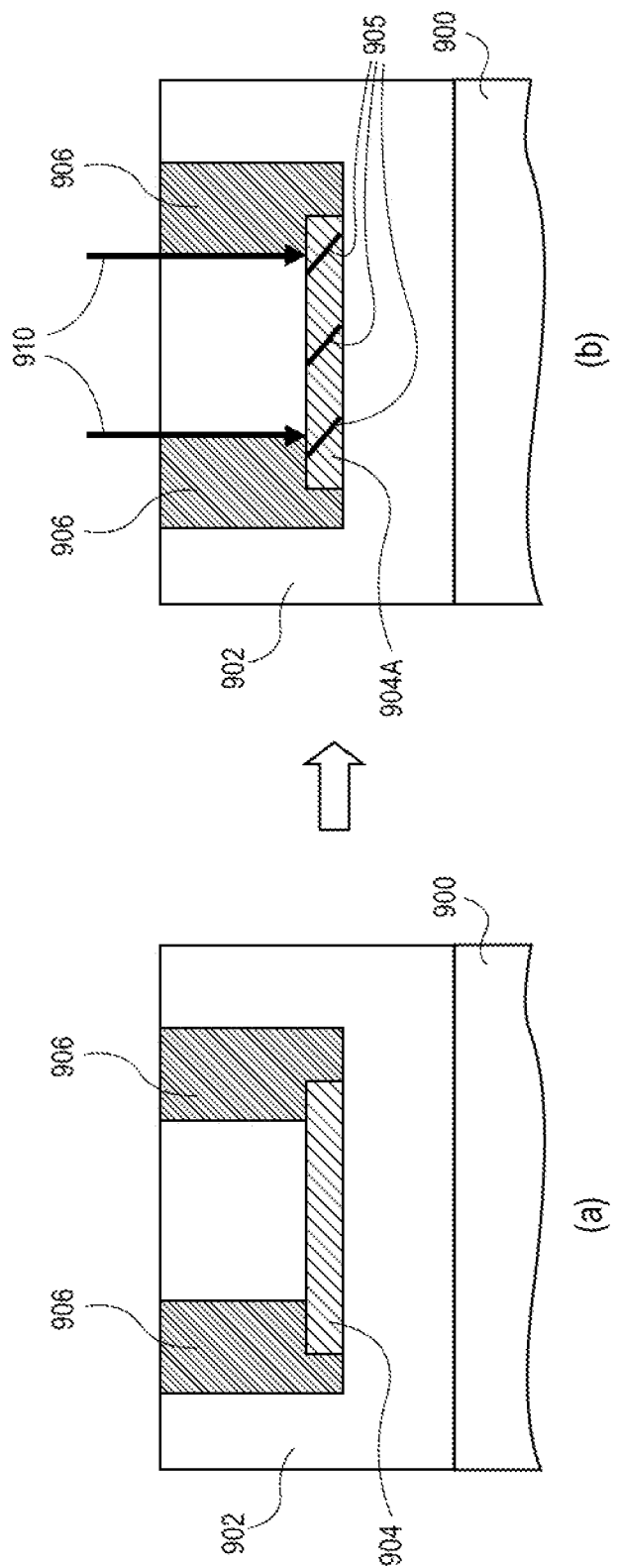
FIG. 9 illustrates cross-sectional views of the formation of a buried channel structure.

Referring to part (a) of FIG. 9, a dielectric layer 902 is above a substrate 900. An active channel 904 is in the dielectric layer 902. Conductive contacts 906, such as copper contacts, are coupled to the active channel 904.

Referring to part (b) of FIG. 9, upon hydrogen or oxygen anneal of the structure of part (a) of FIG. 9, as represented by the arrows 910 of part (b) of FIG. 9, active channel region 904 can become a damaged active region 904A having damaged regions 905 therein.

Referring to FIG. 9, buried active channels (e.g., semiconducting channels) can be degraded when undergoing various end of line anneals due to H or $O_2$ diffusing along a contact side wall, leading to a damaged buried active channel material. It may not be realistic to realize repeatable perfect Cu fill creating a perfect seal with sidewalls that can prevent H or $O_2$ diffusion.

Figure 10:
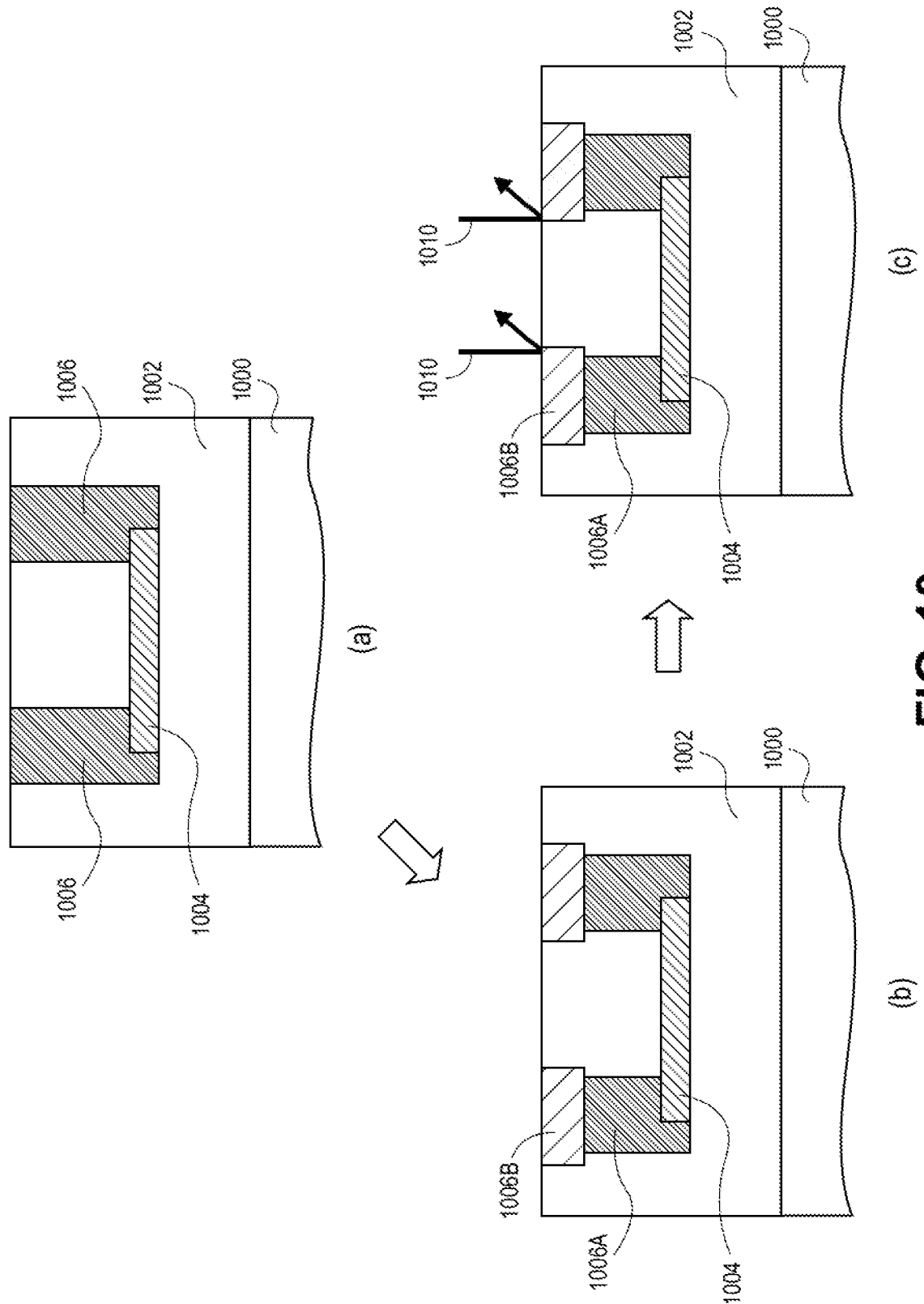
FIG. 10 illustrates cross-sectional views of the formation of a buried channel structure having a protective self-forming barrier, in accordance with an embodiment of the present disclosure.

In contrast to FIG. 9, FIG. 10 illustrates cross-sectional views of the formation of a buried channel structure having a protective self-forming barrier, in accordance with an embodiment of the present disclosure.

Referring to part (a) of FIG. 10, a dielectric layer 1002 is above a substrate 1000. An active channel 1004 is in the dielectric layer 1002. Conductive contacts 1006, such as copper contacts, are coupled to the active channel 1004.

Referring to part (b) of FIG. 10, a treatment such as a forming gas anneal is used to form a top 2D crystal layer 1006B and remaining copper fill 1006A.

Referring to part (c) of FIG. 10, during hydrogen or oxygen anneal of the structure of part (b) of FIG. 10, as represented by the arrows 1010 of part (c) of FIG. 10, active channel region 1004 is protected from damage by the top 2D crystal layer 1006B.

Referring to FIG. 10, top 2D crystal layer 1006B is atomically thin and can prevent diffusion of elements into active channel 1004. The top 2D crystal layer 1006B can be formed by treating fill material 1006 or by deposition at a temperature compatible with BEOL processing. Furthermore, such a top 2D crystal layer 1006B can effectively expand by filling empty regions along the sidewalls of contacts 1006. Such an atomically thin barrier can be grown using the top of a Cu region (e.g., by self-passivation). The crystal expands (e.g., amorphous to crystalline) closing off any gaps to provide high quality passivation and/or sealing.

In another aspect, the integrated circuit structures described herein may be included in an electronic device. As a first example of an apparatus that may include one or more of the TFTs disclosed herein, FIGS. 11A and 11B are top views of a wafer and dies that include one or more thin film transistors having a linerless self-forming barrier, in accordance with any of the embodiments disclosed herein.

Figure 11B:
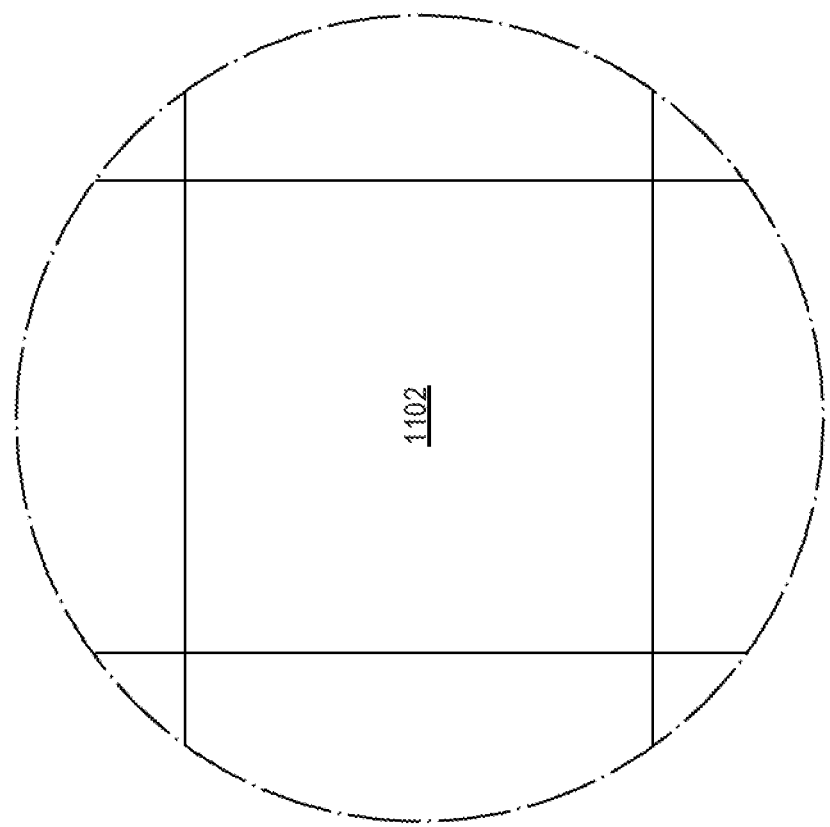
FIGS. 11A and 11B are top views of a wafer and dies that include one or more thin film transistors having a linerless self-forming barrier, in accordance with one or more of the embodiments disclosed herein.
Figure 11A:
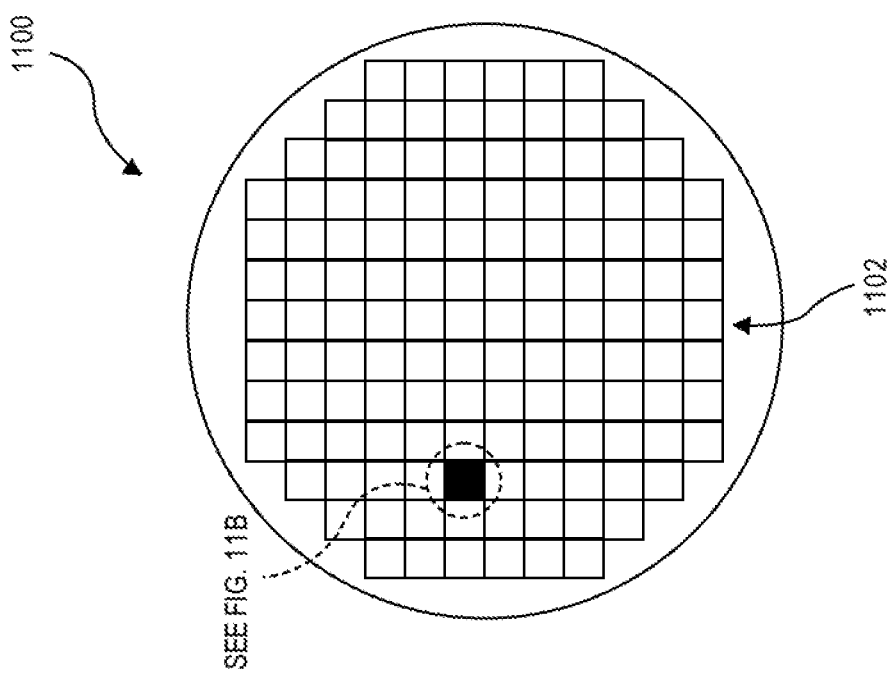

Referring to FIGS. 11A and 11B, a wafer 1100 may be composed of semiconductor material and may include one or more dies 1102 having integrated circuit (IC) structures formed on a surface of the wafer 1100. Each of the dies 1102 may be a repeating unit of a semiconductor product that includes any suitable IC (e.g., ICs including one or more structures such as structures 300, 400, 450, 470, 500 or 600). After the fabrication of the semiconductor product is complete (e.g., after manufacture of structures 300, 400, 450, 470, 500 or 600), the wafer 1100 may undergo a singulation process in which each of the dies 1102 is separated from one another to provide discrete "chips" of the semiconductor product. In particular, devices that include TFT as disclosed herein may take the form of the wafer 1100 (e.g., not singulated) or the form of the die 1102 (e.g., singulated). The die 1102 may include one or more transistors and/or supporting circuitry to route electrical signals to the transistors, as well as any other IC components. In some embodiments, the wafer 1100 or the die 1102 may include a memory device (e.g., a static random access memory (SRAM) device), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device or other logic that is configured to store information in the memory devices or execute instructions stored in the memory array.

Figure 12:
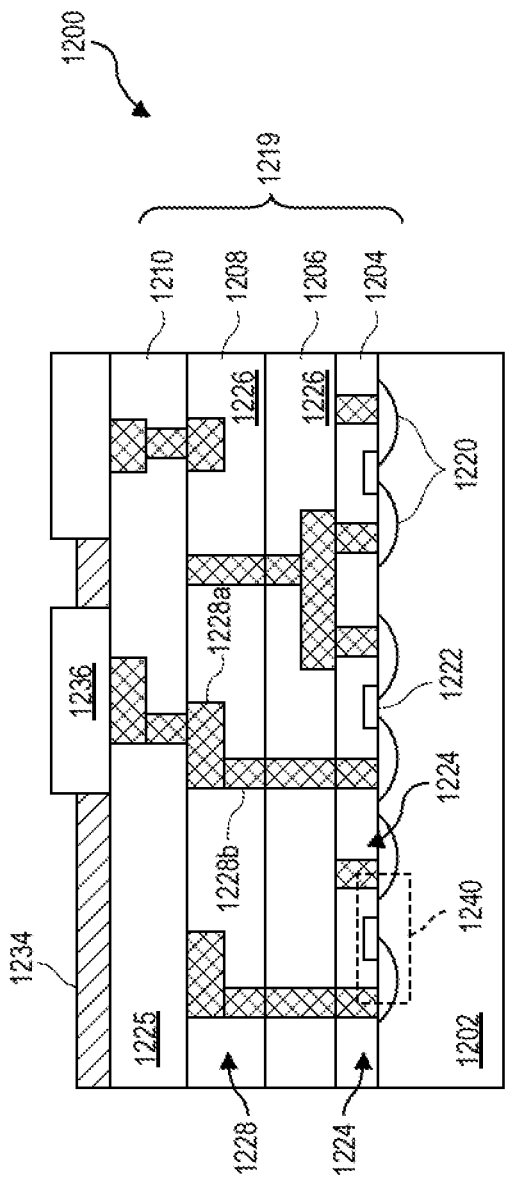
FIG. 12 is a cross-sectional side view of an integrated circuit (IC) device that may include one or more thin film transistors having a linerless self-forming barrier, in accordance with one or more of the embodiments disclosed herein.

FIG. 12 is a cross-sectional side view of an integrated circuit (IC) device that may include one or more thin film transistors having a linerless self-forming barrier, in accordance with one or more of the embodiments disclosed herein.

Referring to FIG. 12, an IC device 1200 is formed on a substrate 1202 (e.g., the wafer 1100 of FIG. 11A) and may be included in a die (e.g., the die 1102 of FIG. 11B), which may be singulated or included in a wafer. Although a few examples of materials from which the substrate 1202 may be formed are described above in association with substrate 402, 452, 502, 602, 700 or a substrate beneath ILD layer 320, any material that may serve as a foundation for an IC device 1200 may be used.

The IC device 1200 may include one or more device layers, such as device layer 1204, disposed on the substrate 1202. The device layer 1204 may include features of one or more transistors 1240 (e.g., TFTs described above) formed on the substrate 1202. The device layer 1204 may include, for example, one or more source and/or drain (S/D) regions 1220, a gate 1222 to control current flow in the transistors 1240 between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 12 and may include a wide variety of other types and configurations such as, for example, planar transistors, non-planar transistors, or a combination of both. Non-planar transistors may include Fin-based transistors, such as double-gate transistors or tri-gate transistors, and wrap-around or all-around gate transistors, such as nanoribbon and nanowire transistors. In particular, one or more of the transistors 1240 take the form of the transistors 300, 400, 450, 470, 500 or 600. Thin-film transistors such as 300, 400, 450, 470, 500 or 600 may be particularly advantageous when used in the metal layers of a microprocessor device for embedded dynamic random access memory (DRAM) circuitry, analog circuitry, logic circuitry, or memory circuitry, and may be formed along with existing complementary metal oxide semiconductor (CMOS) processes.

Electrical signals, such as power and/or input/output (I/O) signals, may be routed to and/or from the transistors 1240 of the device layer 1204 through one or more interconnect layers disposed on the device layer 1204 (illustrated in FIG. 12 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1210. The one or more interconnect layers 1206-1210 may form an interlayer dielectric (ILD) stack 1219 of the IC device 1200.

The interconnect structures 1228 may be arranged within the interconnect layers 1206-1210 to route electrical signals according to a wide variety of designs (in particular, the arrangement is not limited to the particular configuration of interconnect structures 1228 depicted in FIG. 12). Although a particular number of interconnect layers 1206-1210 is depicted in FIG. 12, embodiments of the present disclosure include IC devices having more or fewer interconnect layers than depicted.

In some embodiments, the interconnect structures 1228 may include trench structures 1228a (sometimes referred to as "lines") and/or via structures 1228b filled with an electrically conductive material such as a metal. The trench structures 1228a may be arranged to route electrical signals in a direction of a plane that is substantially parallel with a surface of the substrate 1202 upon which the device layer 1204 is formed. For example, the trench structures 1228a may route electrical signals in a direction in and out of the page from the perspective of FIG. 12. The via structures 1228b may be arranged to route electrical signals in a direction of a plane that is substantially perpendicular to the surface of the substrate 1202 upon which the device layer 1204 is formed. In some embodiments, the via structures 1228b may electrically couple trench structures 1228a of different interconnect layers 1206-1210 together.

The interconnect layers 1206-1210 may include a dielectric material 1226 disposed between the interconnect structures 1228, as shown in FIG. 12. In some embodiments, the dielectric material 1226 disposed between the interconnect structures 1228 in different ones of the interconnect layers 1206-1210 may have different compositions; in other embodiments, the composition of the dielectric material 1226 between different interconnect layers 1206-1210 may be the same. In either case, such dielectric materials may be referred to as inter-layer dielectric (ILD) materials.

A first interconnect layer 1206 (referred to as Metal 1 or "M1") may be formed directly on the device layer 1204. In some embodiments, the first interconnect layer 1206 may include trench structures 1228a and/or via structures 1228b, as shown. The trench structures 1228a of the first interconnect layer 1206 may be coupled with contacts (e.g., the S/D contacts 1224) of the device layer 1204.

A second interconnect layer 1208 (referred to as Metal 2 or "M2") may be formed directly on the first interconnect layer 1206. In some embodiments, the second interconnect layer 1208 may include via structures 1228b to couple the trench structures 1228a of the second interconnect layer 1208 with the trench structures 1228a of the first interconnect layer 1206. Although the trench structures 1228a and the via structures 1228b are structurally delineated with a line within each interconnect layer (e.g., within the second interconnect layer 1208) for the sake of clarity, the trench structures 1228a and the via structures 1228b may be structurally and/or materially contiguous (e.g., simultaneously filled during a dual-damascene process) in some embodiments.

A third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206.

The IC device 1200 may include a solder resist material 1234 (e.g., polyimide or similar material) and one or more bond pads 1236 formed on the interconnect layers 1206-1210. The bond pads 1236 may be electrically coupled with the interconnect structures 1228 and configured to route the electrical signals of the transistor(s) 1240 to other external devices. For example, solder bonds may be formed on the one or more bond pads 1236 to mechanically and/or electrically couple a chip including the IC device 1200 with another component (e.g., a circuit board). The IC device 1200 may have other alternative configurations to route the electrical signals from the interconnect layers 1206-1210 than depicted in other embodiments. For example, the bond pads 1236 may be replaced by or may further include other analogous features (e.g., posts) that route the electrical signals to external components.

Figure 13:
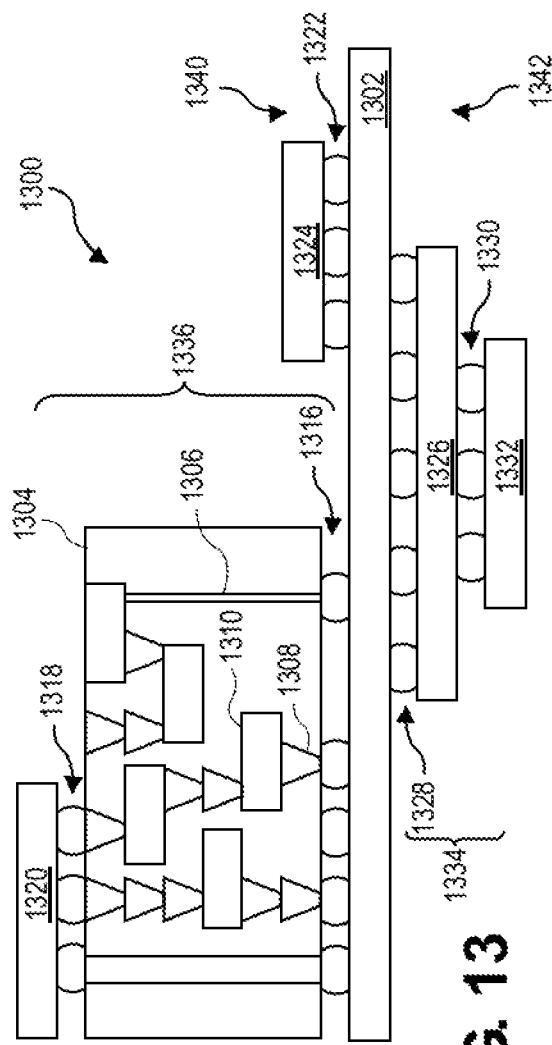
FIG. 13 is a cross-sectional side view of an integrated circuit (IC) device assembly that may include one or more thin film transistors having a linerless self-forming barrier, in accordance with one or more of the embodiments disclosed herein.

FIG. 13 is a cross-sectional side view of an integrated circuit (IC) device assembly that may include one or more thin film transistors having a linerless self-forming barrier, in accordance with one or more of the embodiments disclosed herein.

Referring to FIG. 13, an IC device assembly 1300 includes components having one or more integrated circuit structures described herein. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302. Generally, components may be disposed on one or both faces 1340 and 1342. In particular, any suitable ones of the components of the IC device assembly 1300 may include a number of the TFT structures 300, 400, 450, 470, 500 or 600 disclosed herein.

In some embodiments, the circuit board 1302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 13 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 13), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 13, multiple IC packages may be coupled to the interposer 1304. It is to be appreciated that additional interposers may be coupled to the interposer 1304. The interposer 1304 may provide an intervening substrate used to bridge the circuit board 1302 and the IC package 1320. The IC package 1320 may be or include, for example, a die (the die 1102 of FIG. 11B), an IC device (e.g., the IC device 1200 of FIG. 12), or any other suitable component. Generally, the interposer 1304 may spread a connection to a wider pitch or reroute a connection to a different connection. For example, the interposer 1304 may couple the IC package 1320 (e.g., a die) to a ball grid array (BGA) of the coupling components 1316 for coupling to the circuit board 1302. In the embodiment illustrated in FIG. 13, the IC package 1320 and the circuit board 1302 are attached to opposing sides of the interposer 1304. In other embodiments, the IC package 1320 and the circuit board 1302 may be attached to a same side of the interposer 1304. In some embodiments, three or more components may be interconnected by way of the interposer 1304.

The interposer 1304 may be formed of an epoxy resin, a fiberglass-reinforced epoxy resin, a ceramic material, or a polymer material such as polyimide. In some implementations, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to through-silicon vias (TSVs) 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 13 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 14:
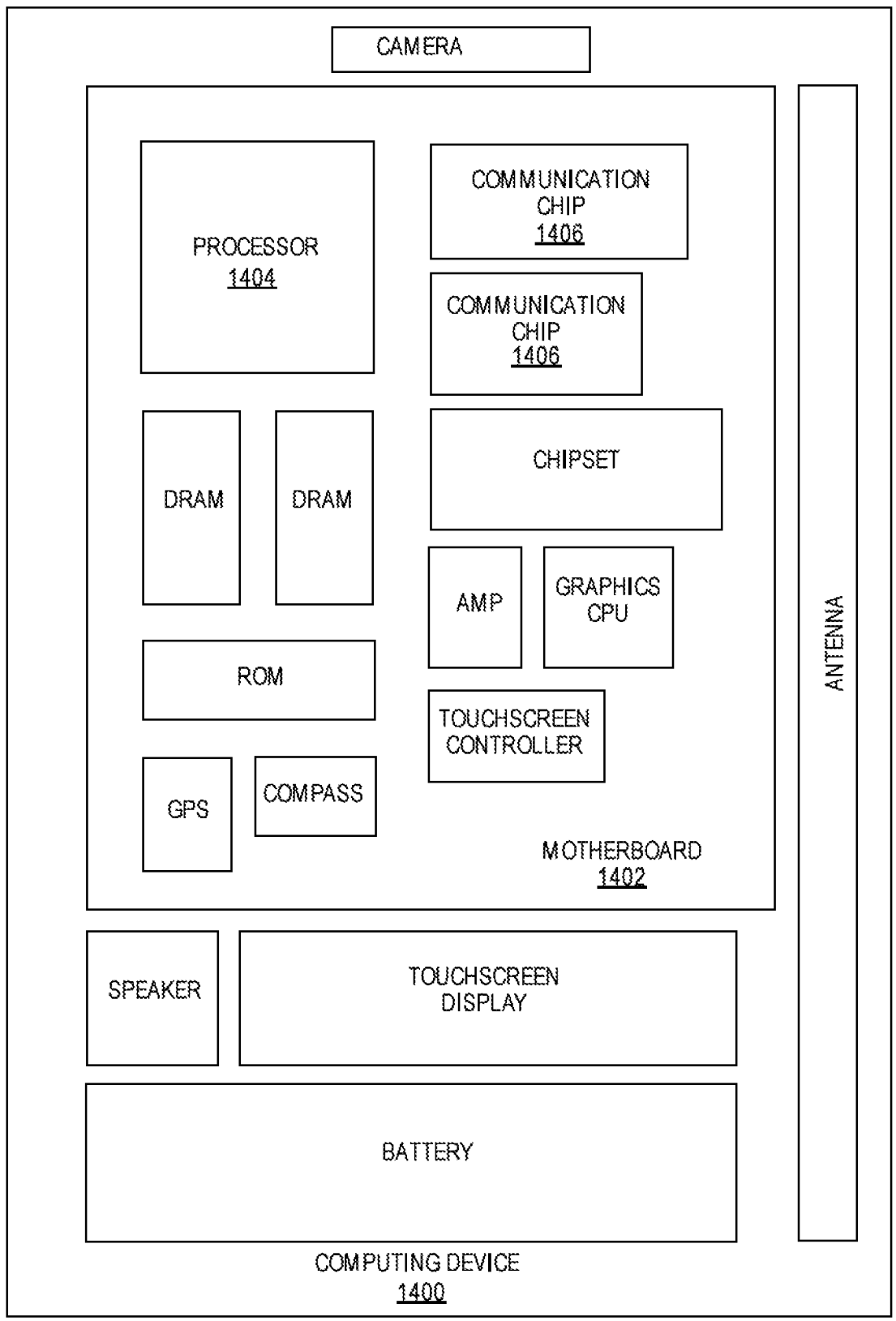
FIG. 14 illustrates a computing device in accordance with one implementation of an embodiment of the disclosure.

FIG. 14 illustrates a computing device 1400 in accordance with one implementation of the disclosure. The computing device 1400 houses a board 1402. The board 1402 may include a number of components, including but not limited to a processor 1404 and at least one communication chip 1406. The processor 1404 is physically and electrically coupled to the board 1402. In some implementations the at least one communication chip 1406 is also physically and electrically coupled to the board 1402. In further implementations, the communication chip 1406 is part of the processor 1404.

Depending on its applications, computing device 1400 may include other components that may or may not be physically and electrically coupled to the board 1402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 includes an integrated circuit die packaged within the processor 1404. In some implementations of the disclosure, the integrated circuit die of the processor includes one or more thin film transistors having a linerless self-forming barrier, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1406 also includes an integrated circuit die packaged within the communication chip 1406. In accordance with another implementation of embodiments of the disclosure, the integrated circuit die of the communication chip includes one or more thin film transistors having a linerless self-forming barrier, in accordance with implementations of embodiments of the disclosure.

In further implementations, another component housed within the computing device 1400 may contain an integrated circuit die that includes one or more thin film transistors having a linerless self-forming barrier, in accordance with implementations of embodiments of the disclosure.

In various implementations, the computing device 1400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

Thus, embodiments described herein include integrated circuit structures having linerless self-forming barriers, and methods of fabricating integrated circuit structures having linerless self-forming barriers.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a dielectric material above a substrate. An interconnect structure is in a trench in the dielectric material. The interconnect structure includes a conductive fill material and a two-dimensional (2D) crystalline liner. The 2D crystalline liner is in direct contact with the dielectric material and with the conductive fill material. The 2D crystalline liner includes a same metal species as the conductive fill material.

Example embodiment 2: The integrated circuit structure of example embodiment 1, wherein the 2D crystalline liner is a monolayer.

Example embodiment 3: The integrated circuit structure of example embodiment 1 or 2, wherein the 2D crystalline liner has a thickness of less than 5 nanometers.

Example embodiment 4: The integrated circuit structure of example embodiment 1, 2 or 3, wherein the metal species is copper.

Example embodiment 5: The integrated circuit structure of example embodiment 1, 2 or 3, wherein the metal species is cobalt.

Example embodiment 6: The integrated circuit structure of example embodiment 1, 2 or 3, wherein the metal species is tungsten.

Example embodiment 7: The integrated circuit structure of example embodiment 1, 2, 3, 4, 5 or 6, wherein the 2D crystalline liner is further on a top surface of the interconnect structure.

Example embodiment 8: The integrated circuit structure of example embodiment 1, 2, 3, 4, 5, 6 or 7, wherein the interconnect structure includes a conductive line on a conductive via.

Example embodiment 9: An integrated circuit structure includes a semiconducting oxide material over a gate electrode. A pair of conductive contacts is on a first region of the semiconducting oxide material, with a second region of the semiconducting oxide material between the pair of conductive contacts. Each of the pair of conductive contacts includes a conductive fill material and a two-dimensional (2D) crystalline liner. The 2D crystalline liner is in direct contact with the semiconducting oxide material and with the conductive fill material. The 2D crystalline liner includes a same metal species as the conductive fill material.

Example embodiment 10: The integrated circuit structure of example embodiment 9, wherein the 2D crystalline liner is a monolayer.

Example embodiment 11: The integrated circuit structure of example embodiment 9 or 10, wherein the 2D crystalline liner has a thickness of less than 5 nanometers.

Example embodiment 12: The integrated circuit structure of example embodiment 9, 10 or 11, wherein the metal species is copper.

Example embodiment 13: The integrated circuit structure of example embodiment 9, 10 or 11, wherein the metal species is cobalt.

Example embodiment 14: The integrated circuit structure of example embodiment 9, 10 or 11, wherein the metal species is tungsten.

Example embodiment 15: The integrated circuit structure of example embodiment 9, 10, 11, 12, 13 or 14, wherein the semiconducting oxide material includes a material selected from the group consisting of indium gallium zinc oxide, tin oxide, antimony oxide, indium oxide, indium tin oxide, titanium oxide, zinc oxide, indium zinc oxide, gallium oxide, titanium oxynitride, ruthenium oxide and tungsten oxide.

Example embodiment 16: The integrated circuit structure of example embodiment 9, 10, 11, 12, 13, 14 or 15, further including a gate dielectric layer between the gate electrode and the semiconducting oxide material.

Example embodiment 17: The integrated circuit structure of example embodiment 16, wherein the gate dielectric layer comprises a layer of a high-k dielectric material directly on the semiconducting oxide material.

Example embodiment 18: An integrated circuit structure includes a semiconductor fin. A gate electrode is over the semiconductor fin. The gate electrode includes a conductive fill material and a two-dimensional (2D) crystalline liner. The 2D crystalline liner is in direct contact with the conductive fill material. The 2D crystalline liner includes a same metal species as the conductive fill material. The 2D crystalline liner has a different workfunction than the conductive fill material.

Example embodiment 19: The integrated circuit structure of example embodiment 18, wherein the 2D crystalline liner is a monolayer.

Example embodiment 20: The integrated circuit structure of example embodiment 18 or 19, wherein the 2D crystalline liner has a thickness of less than 5 nanometers.

Example embodiment 21: The integrated circuit structure of example embodiment 18, 19 or 20, wherein the metal species is copper.

Example embodiment 22: The integrated circuit structure of example embodiment 18, 19 or 20, wherein the metal species is cobalt.

Example embodiment 23: The integrated circuit structure of example embodiment 18, 19 or 20, wherein the metal species is tungsten.

What is claimed is:

1. An integrated circuit structure, comprising:
a dielectric material above a substrate; and
an interconnect structure in a trench in the dielectric material, the interconnect structure comprising a conductive fill material and a two-dimensional (2D) crystalline liner, the 2D crystalline liner in direct contact with the dielectric material and in direct contact with the conductive fill material, wherein the conductive fill material is a single material that completely fills a volume laterally surrounded by the 2D crystalline liner, and wherein the 2D crystalline liner comprises a same metal species as the conductive fill material.

2. The integrated circuit structure of claim 1, wherein the 2D crystalline liner is a monolayer.

3. The integrated circuit structure of claim 1, wherein the 2D crystalline liner has a thickness of less than 5 nanometers.

4. The integrated circuit structure of claim 1, wherein the metal species is copper.

5. The integrated circuit structure of claim 1, wherein the metal species is cobalt.

6. The integrated circuit structure of claim 1, wherein the metal species is tungsten.

7. The integrated circuit structure of claim 1, wherein the 2D crystalline liner is further on a top surface of the interconnect structure.

8. The integrated circuit structure of claim 1, wherein the interconnect structure comprises a conductive line on a conductive via.

9. An integrated circuit structure, comprising:
a semiconducting oxide material over a gate electrode;
a pair of conductive contacts on a first region of the semiconducting oxide material, with a second region of the semiconducting oxide material between the pair of conductive contacts, wherein each of the pair of conductive contacts comprises a conductive fill material and a conductive two-dimensional (2D) crystalline liner, the conductive 2D crystalline liner in direct contact with the semiconducting oxide material and with the conductive fill material, and the conductive 2D crystalline liner comprising a same metal species as the conductive fill material, wherein the conductive 2D crystalline liner has an uppermost surface at a same level as an uppermost surface of the conductive fill material.

10. The integrated circuit structure of claim 9, wherein the conductive 2D crystalline liner is a monolayer.

11. The integrated circuit structure of claim 9, wherein the conductive 2D crystalline liner has a thickness of less than 5 nanometers.

12. The integrated circuit structure of claim 9, wherein the metal species is copper.

13. The integrated circuit structure of claim 9, wherein the metal species is cobalt.

14. The integrated circuit structure of claim 9, wherein the metal species is tungsten.

15. The integrated circuit structure of claim 9, wherein the semiconducting oxide material comprises a material selected from the group consisting of indium gallium zinc oxide, tin oxide, antimony oxide, indium oxide, indium tin oxide, titanium oxide, zinc oxide, indium zinc oxide, gallium oxide, titanium oxynitride, ruthenium oxide and tungsten oxide.

16. The integrated circuit structure of claim 9, further comprising:
a gate dielectric layer between the gate electrode and the semiconducting oxide material.

17. The integrated circuit structure of claim 16, wherein the gate dielectric layer comprises a layer of a high-k dielectric material directly on the semiconducting oxide material.

18. An integrated circuit structure, comprising:
a semiconductor fin; and
a gate electrode over the semiconductor fin, the gate electrode comprising a conductive fill material and a two-dimensional (2D) crystalline liner, the 2D crystalline liner in direct contact with the conductive fill material, wherein the conductive fill material is a single material that completely fills a volume laterally surrounded by the 2D crystalline liner, wherein the 2D crystalline liner comprises a same metal species as the conductive fill material, and wherein the 2D crystalline liner has a different workfunction than the conductive fill material.

19. The integrated circuit structure of claim 18, wherein the 2D crystalline liner is a monolayer.

20. The integrated circuit structure of claim 18, wherein the 2D crystalline liner has a thickness of less than 5 nanometers.

21. The integrated circuit structure of claim 18, wherein the metal species is copper.

22. The integrated circuit structure of claim 18, wherein the metal species is cobalt.

23. The integrated circuit structure of claim 18, wherein the metal species is tungsten.

* * * * *